United States Patent
Yoneda et al.

(10) Patent No.: US 11,991,438 B2
(45) Date of Patent: May 21, 2024

(54) IMAGING DEVICE AND ELECTRONIC DEVICE

(71) Applicant: SEMICONDUCTOR ENERGY LABORATORY CO., LTD., Atsugi (JP)

(72) Inventors: Seiichi Yoneda, Kanagawa (JP); Yusuke Negoro, Osaka (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 186 days.

(21) Appl. No.: 17/626,566

(22) PCT Filed: Jul. 9, 2020

(86) PCT No.: PCT/IB2020/056448
§ 371 (c)(1),
(2) Date: Jan. 12, 2022

(87) PCT Pub. No.: WO2021/014258
PCT Pub. Date: Jan. 28, 2021

(65) Prior Publication Data
US 2022/0321794 A1 Oct. 6, 2022

(30) Foreign Application Priority Data

Jul. 19, 2019 (JP) .................. 2019-133327
Jul. 26, 2019 (JP) .................. 2019-137548

(51) Int. Cl.
*H04N 23/63* (2023.01)
*H01L 27/146* (2006.01)

(52) U.S. Cl.
CPC ..... *H04N 23/631* (2023.01); *H01L 27/14605* (2013.01); *H01L 27/14607* (2013.01); *H01L 27/14616* (2013.01)

(58) Field of Classification Search
CPC ...... H04N 23/631; H04N 25/46; H04N 25/77; H04N 25/75; H04N 25/745; H04N 25/76;
(Continued)

(56) References Cited

U.S. PATENT DOCUMENTS

| 7,947,528 B2 | 5/2011 | Iwabuchi et al. |
| 8,049,293 B2 | 11/2011 | Iwabuchi et al. |

(Continued)

FOREIGN PATENT DOCUMENTS

| CN | 110651468 A | 1/2020 |
| JP | 2011-119711 A | 6/2011 |

(Continued)

OTHER PUBLICATIONS

International Search Report (Application No. PCT/IB2020/056448) dated Oct. 6, 2020.
(Continued)

*Primary Examiner* — Christopher K Peterson
(74) *Attorney, Agent, or Firm* — Fish & Richardson P.C.

(57) ABSTRACT

An imaging device capable of executing image processing is provided. An imaging device with low power consumption is provided. A highly reliable imaging device is provided. An imaging device with higher integration degree of pixels is provided. An imaging device manufactured at low cost is provided. The imaging device includes a photoelectric conversion device, a first transistor that is formed in a first layer and includes silicon in a channel formation layer, and a capacitor that is formed in a second layer bonded to the first layer. One of a source and a drain of the first transistor is electrically connected to one of electrodes of the photoelectric conversion device, and the other of the source and the drain of the first transistor is electrically connected to one of electrodes of the capacitor. A pixel having a function of generating first data and a function of multiplying the first (Continued)

data to have a given magnification to generate second data is included. The first data and the second data each have an analog value.

20 Claims, 20 Drawing Sheets

(58) Field of Classification Search
CPC ......... H01L 27/14605; H01L 27/14607; H01L 27/14616; H01L 27/146; H01L 27/14609; H01L 27/14612; H01L 27/14643
See application file for complete search history.

(56) References Cited

U.S. PATENT DOCUMENTS

| | | |
|---|---|---|
| 8,309,392 B2 | 11/2012 | Iwabuchi et al. |
| 8,378,391 B2 | 2/2013 | Koyama et al. |
| 8,440,499 B2 | 5/2013 | Iwabuchi et al. |
| 8,841,743 B2 | 9/2014 | Iwabuchi et al. |
| 8,916,869 B2 | 12/2014 | Koyama et al. |
| 8,946,610 B2 | 2/2015 | Iwabuchi et al. |
| 9,117,710 B2 | 8/2015 | Iwabuchi et al. |
| 9,331,112 B2 | 5/2016 | Koyama et al. |
| 9,673,249 B2 | 6/2017 | Iwabuchi et al. |
| 9,773,814 B2 | 9/2017 | Koyama et al. |
| 10,389,961 B2 | 8/2019 | Kurokawa |
| 10,582,141 B2 | 3/2020 | Kurokawa |
| 11,101,302 B2 | 8/2021 | Ikeda et al. |
| 11,195,866 B2 | 12/2021 | Ikeda |
| 11,202,026 B2 | 12/2021 | Kurokawa |
| 2010/0201834 A1 | 8/2010 | Maruyama et al. |
| 2010/0276572 A1 | 11/2010 | Iwabuchi et al. |
| 2016/0172410 A1 | 6/2016 | Kurokawa |
| 2019/0327432 A1* | 10/2019 | Milkov ................ H04N 25/65 |
| 2020/0091214 A1 | 3/2020 | Ikeda |
| 2020/0176493 A1* | 6/2020 | Ikeda ..................... H04N 25/40 |
| 2020/0186732 A1* | 6/2020 | Takizawa ............ H04N 25/621 |
| 2020/0226457 A1 | 7/2020 | Ikeda et al. |
| 2021/0233952 A1 | 7/2021 | Kurokawa |
| 2021/0384239 A1 | 12/2021 | Ikeda et al. |

FOREIGN PATENT DOCUMENTS

| | | | |
|---|---|---|---|
| JP | 2013-179313 A | 9/2013 | |
| JP | 2016-123087 A | 7/2016 | |
| JP | 2018-117027 A | 7/2018 | |
| KR | 2020-0012917 A | 2/2020 | |
| WO | WO-2018/215882 | 11/2018 | |
| WO | WO-2018215882 A1 * | 11/2018 | ......... H01L 27/1225 |
| WO | WO-2018/224910 | 12/2018 | |

OTHER PUBLICATIONS

Written Opinion (Application No. PCT/IB2020/056448) dated Oct. 6, 2020.

* cited by examiner $a = x_1 w_1 + x_2 w_2 + b$

IMAGING DEVICE AND ELECTRONIC DEVICE

CROSS REFERENCE TO RELATED APPLICATIONS

This application is a U.S. National Phase Application under 35 U.S.C. § 371 of International Application PCT/IB2020/056448, filed on Jul. 9, 2020, which is incorporated by reference and claims the benefit of foreign priority applications filed in Japan on Jul. 19, 2019, as Application No. 2019-133327 and on Jul. 26, 2019, as Application No. 2019-137548.

TECHNICAL FIELD

One embodiment of the present invention relates to an imaging device.

Note that one embodiment of the present invention is not limited to the above technical field. The technical field of one embodiment of the invention disclosed in this specification and the like relates to an object, a method, or a manufacturing method. One embodiment of the present invention relates to a process, a machine, manufacture, or a composition of matter. Specifically, examples of the technical field of one embodiment of the present invention disclosed in this specification include a semiconductor device, a display device, a liquid crystal display device, a light-emitting device, a lighting device, a power storage device, a memory device, an imaging device, a driving method thereof, and a manufacturing method thereof.

In this specification and the like, a semiconductor device means every device that can function by utilizing semiconductor characteristics. A transistor and a semiconductor circuit are embodiments of semiconductor devices. In some cases, a memory device, a display device, an imaging device, or an electronic device includes a semiconductor device.

BACKGROUND ART

A technique for forming a transistor by using an oxide semiconductor thin film formed over a substrate has attracted attention. For example, an imaging device with a structure in which a transistor including an oxide semiconductor and having an extremely low off-state current is used in a pixel circuit is disclosed in Patent Document 1.

A technique which adds an arithmetic function to an imaging device is disclosed in Patent Document 2.

In Patent Document 3, an imaging element including a plurality of sensor chips is disclosed.

REFERENCE

Patent Document

[Patent Document 1] Japanese Published Patent Application No. 2011-119711
[Patent Document 2] Japanese Published Patent Application No. 2016-123087
[Patent Document 3] Japanese Published Patent Application No. 2018-117027

SUMMARY OF THE INVENTION

Problems to be Solved by the Invention

With the technological development, a high-quality image can be easily captured by an imaging device provided with a solid-state imaging element such as a CMOS image sensor. In the next generation, an imaging device is required to be equipped with more intelligent functions.

In the present image data compression, image recognition, or the like, image data (analog data) is converted into digital data, taken out to the outside of the imaging device, and then subjected to processing. If the processing can be carried out in the imaging device, higher-speed communication with an external device is achieved, improving user's convenience. Furthermore, load and power consumption of a peripheral device or the like can be reduced. Moreover, if complicated data processing is performed using analog data not converted, time required for data conversion can be shortened.

Thus, an object of one embodiment of the present invention is to provide an imaging device capable of image processing. Another object is to provide an imaging device with low power consumption. Another object is to provide an imaging device with high reliability. Another object is to provide a novel imaging device or the like. Another object is to provide a method for driving the above imaging device.

Another object of one embodiment of the present invention is to provide an imaging device capable of inhibiting analog data fluctuation and executing data processing. Another object is to provide an imaging device capable of executing analog data processing with reduced power consumption. Another object is to provide an imaging device with a reduced circuit area. Another object is to provide an imaging device including a photoelectric conversion device with a large area. Another object is to provide an imaging device in which the degree of integration of pixels is increased. Another object is to provide an imaging device at low cost. Another object is to provide a novel semiconductor device or the like.

Note that the description of these objects does not preclude the existence of other objects. One embodiment of the present invention does not have to achieve all these objects. Other objects are apparent from and can be derived from the description of the specification, the drawings, the claims, and the like.

Means for Solving the Problems

One embodiment of the present invention relates to an imaging device which can retain data in a pixel and perform arithmetic processing on the data.

One embodiment of the present invention is an imaging device including a pixel block and a first circuit; the pixel block includes a plurality of pixels arranged in a matrix; the pixel block and the first circuit are electrically connected; each of the plurality of pixels includes a photoelectric conversion device, a first transistor, a second transistor, and a capacitor; the photoelectric conversion device and the first transistor are formed in a first layer; the capacitor is formed in a second layer; the second layer is bonded to the first layer; each of the first transistor and the second transistor includes silicon in a channel formation region; one of a source and a drain of the first transistor is electrically connected to one of electrodes of the photoelectric conversion device, and the other is electrically connected to one of electrodes of the capacitor; one of a source and a drain of the second transistor is electrically connected to the other electrode of the capacitor; each of the plurality of pixels has a function of generating first data and a function of multiplying the first data to have a given magnification to generate second data; the first circuit has a function of generating third data corresponding to a total of the first data generated by the plurality of pixels and a function of adding a potential corresponding to a total of the second data generated by the plurality of pixels to the third data by capacitive coupling to form fourth data; and the first data and the second data each have an analog value. The plurality of pixels included in the pixel block is electrically connected to the first circuit.

Another embodiment of the present invention is an imaging device including a pixel block and a first circuit; the pixel block includes a plurality of pixels arranged in a matrix; the plurality of pixels and the first circuit are electrically connected; each of the plurality of pixels include a photoelectric conversion device, a first transistor, a second transistor, and a capacitor; the photoelectric conversion device and the first transistor are formed in a first layer; the capacitor and the second transistor are formed in a second layer; the second layer is bonded to the first layer in a bonding step; each of the first transistor and the second transistor includes silicon in a channel formation region; one of a source and a drain of the first transistor is electrically connected to one of electrodes of the photoelectric conversion device, and the other is electrically connected to one of electrodes of the capacitor; one of a source and a drain of the second transistor is electrically connected to the other electrode of the capacitor; each of the plurality of pixels has a function of generating first data and a function of multiplying the first data to a given magnification to form second data; the first circuit has a function of generating third data corresponding to a total of the first data generated by the plurality of pixels and a function of adding a potential corresponding to a total of the second data generated by the plurality of pixels to the third data by capacitive coupling to form fourth data; and the first data and the second data each have an analog value.

In the above structure, the first layer is preferably formed over a first silicon substrate, and an n-type region included in the photoelectric conversion device preferably serves as the one of the source and the drain of the first transistor.

In the above structure, the capacitor is preferably a trench capacitor.

Another embodiment of the present invention is an electronic device including the imaging device described above and a display device.

Effect of the Invention

With one embodiment of the present invention, an imaging device capable of executing image processing can be provided. An imaging device with low power consumption can be provided. An imaging device with high reliability can be provided. A novel imaging device or the like can be provided. A method for driving the above imaging device can be provided.

With use of one embodiment of the present invention, an imaging device capable of inhibiting analog data fluctuation and executing data processing can be provided. Furthermore, an imaging device capable of executing analog data processing with low power consumption can be provided. Furthermore, an imaging device with a reduced circuit area can be provided. Furthermore, an imaging device including a photoelectric conversion device with a large area can be provided. Furthermore, an imaging device in which the degree of integration of pixels is increased can be provided. Furthermore, an imaging device manufactured at low cost can be provided. Furthermore, a novel semiconductor device can be provided.

MODE FOR CARRYING OUT THE INVENTION

Figure 1:
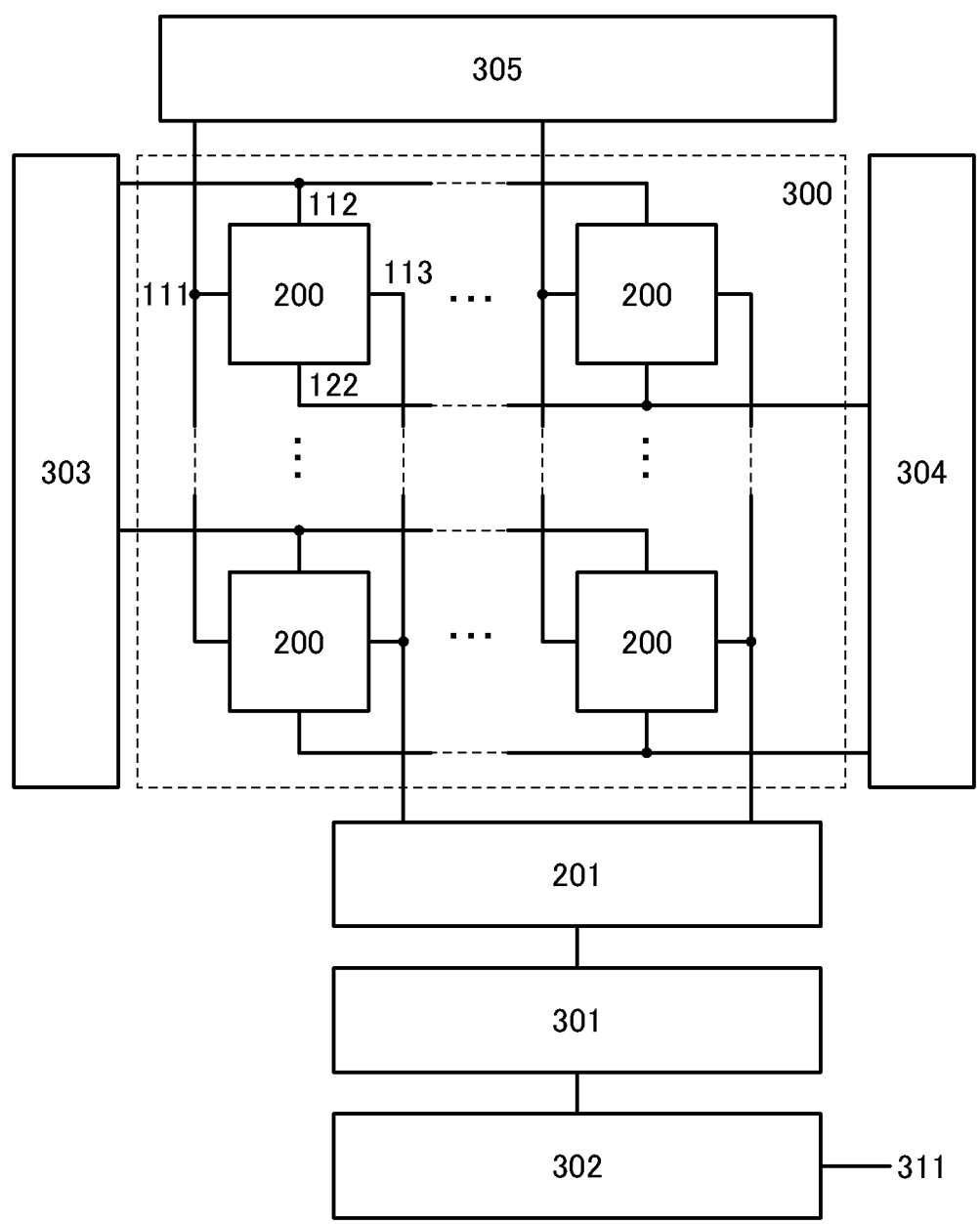
FIG. 1 is a block diagram illustrating an imaging device.

Embodiments are described in detail with reference to the drawings. However, the present invention is not limited to the following description, and it is readily appreciated by those skilled in the art that modes and details can be modified in various ways without departing from the spirit and the scope of the present invention. Therefore, the present invention should not be interpreted as being limited to the description of the embodiment below. Note that in structures of the invention described below, the same portions or portions having similar functions are denoted by the same reference numerals in different drawings, and the description thereof is not repeated in some cases. The same components are denoted by different hatching patterns in different drawings, or the hatching patterns are omitted in some cases.

Even in the case where a single component is illustrated in a circuit diagram, the component may be composed of a plurality of parts as long as there is no functional inconvenience. For example, in some cases, a plurality of transistors that operate as a switch are connected in series or in parallel. In some cases, capacitors are divided and arranged in a plurality of positions.

One conductor has a plurality of functions such as a wiring, an electrode, and a terminal in some cases. In this specification, a plurality of names are used for the same component in some cases. Even in the case where components are illustrated in a circuit diagram as if they were directly connected to each other, the components may actually be connected to each other through a plurality of conductors; in this specification, even such a structure is included in the category of direct connection.

Embodiment 1

In this embodiment, an imaging device of one embodiment of the present invention is described with reference to drawings.

One embodiment of the present invention is an imaging device having an additional function such as image recognition. The imaging device can retain analog data (image data) obtained by an image-capturing operation in a pixel and extract data obtained by multiplying the analog data by a predetermined weight coefficient.

When the data is taken in a neural network or the like, processing such as image recognition can be performed. Since enormous volumes of image data in the state of analog data can be retained in pixels, processing can be performed efficiently.

FIG. 1 is a block diagram illustrating an imaging device of one embodiment of the present invention. The imaging device includes a pixel array 300, a circuit 201, a circuit 301, a circuit 302, a circuit 303, a circuit 304, and a circuit 305. Note that the structures of the circuit 201 and the circuit 301 to the circuit 305 are not limited to single circuits and may each consist of a plurality of circuits. Furthermore, any of two or more of the circuits described above may be combined. The pixel array 300 has an image-capturing function and an arithmetic function. The circuits 201 and 301 each have an arithmetic function. The circuit 302 has an arithmetic function or a data conversion function. The circuits 303 and 304 each have a selection function. The circuit 305 has a function of supplying a potential to a pixel.

Figure 2:
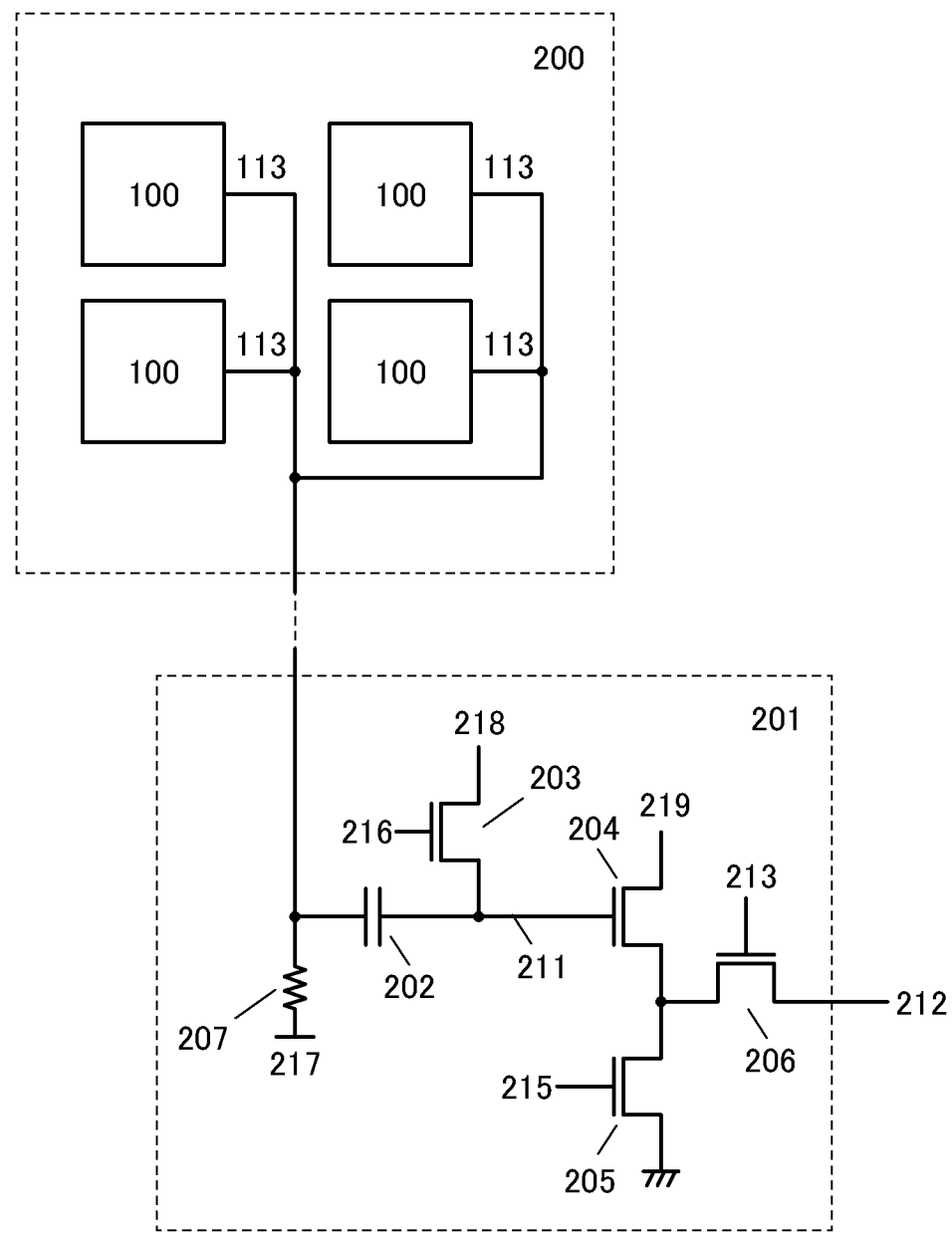
FIG. 2 is a diagram illustrating a pixel block 200 and a circuit 201.

The pixel array 300 includes a plurality of pixel blocks 200. As illustrated in FIG. 2, the pixel block 200 includes a plurality of pixels 100 arranged in a matrix, and each of the pixels 100 is electrically connected to the circuit 201. Note that the circuit 201 can also be provided in the pixel block 200.

The pixel 100 can obtain image data. Note that the number of pixels is 2×2 in an example illustrated in FIG. 2 but is not limited to this.

The pixel block 200 operates as a product-sum operation circuit. The circuit 201 electrically connected to the pixel block 200 can extract the product of the image data and a weight coefficient from the pixel 100. The circuit 201 also has a function of a correlated double sampling circuit (CDS circuit).

Figure 3A:
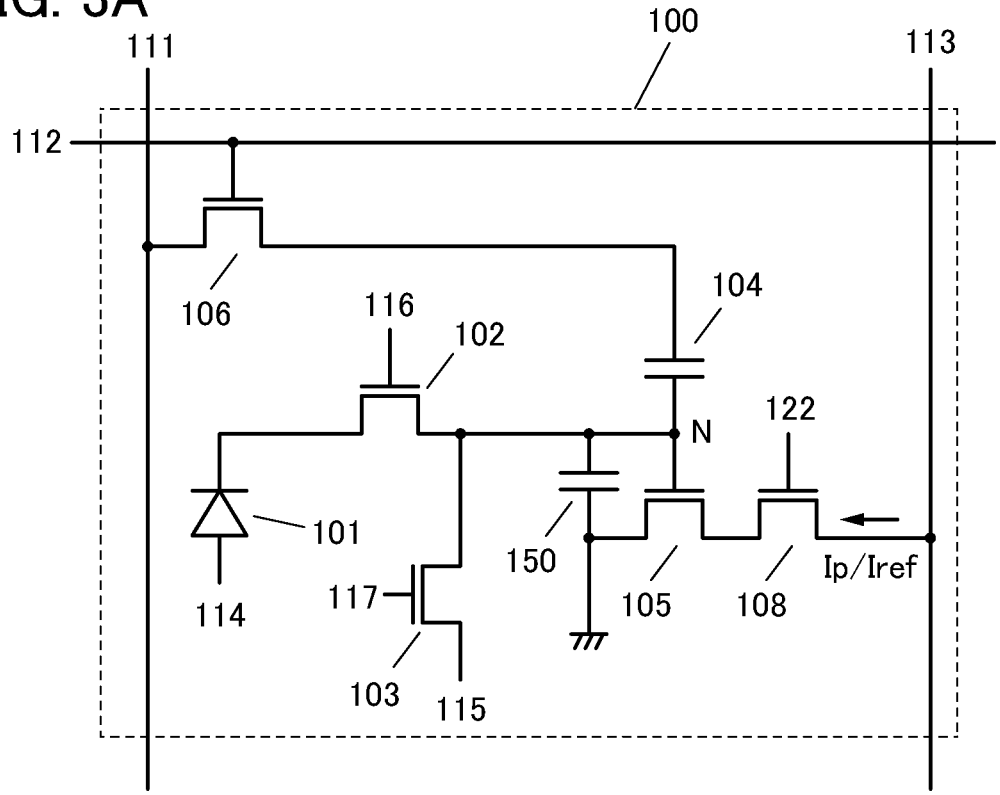
FIG. 3A and FIG. 3B are diagrams illustrating a pixel 100.

As illustrated in FIG. 3A, the pixel 100 can include a photoelectric conversion device 101, a transistor 102, a transistor 103, a capacitor 104, a transistor 105, a transistor 106, a transistor 108, and a capacitor 150.

One electrode of the photoelectric conversion device 101 is electrically connected to one of a source and a drain of the transistor 102. The other of the source and the drain of the transistor 102 is electrically connected to one of a source and a drain of the transistor 103. The one of the source and the drain of the transistor 103 is electrically connected to one of electrodes of the capacitor 104. The one electrode of the capacitor 104 is electrically connected to a gate of the transistor 105. One of a source and a drain of the transistor 105 is electrically connected to one of a source and a drain of the transistor 108. The other electrode of the capacitor 104 is electrically connected to one of a source and a drain of the transistor 106.

One of electrodes of the capacitor 150 is electrically connected to the gate of the transistor 105. The other electrode of the capacitor 150 is electrically connected to a ground potential. The other electrode of the capacitor 150 may be electrically connected to a substrate potential of a silicon substrate, for example. Although FIG. 3A shows an example in which the other of the source and the drain of the transistor 105 is electrically connected to the other electrode of the capacitor 150, they may be independently connected to wirings with different potentials or the like. In addition, although FIG. 3A shows an example in which the other of the source and the drain of the transistor 105 is electrically connected to the ground potential, the other of the source and the drain of the transistor 105 may be electrically connected to a signal line or the like.

Here, a point where the other of the source and the drain of the transistor 102, the one of the source and the drain of the transistor 103, the one of electrodes of the capacitor 104, and the gate of the transistor 105 are electrically connected is referred to as a node N.

By increasing the capacitance of the capacitor 104 and the capacitor 150, a change in the potential at the node N can be inhibited. Note that the pixel 100 may have a structure in which either the capacitor 104 or the capacitor 150 is not provided.

By increasing the capacitance of one or both of the capacitor 104 and the capacitor 150, the amount of charges accumulated in the node N can be increased, for example, whereby a change in potential due to leakage can be inhibited. By increasing the capacitance, the voltage of a signal supplied to a wiring 111 can be lowered, for example. Thus, power consumption of the circuit 305 can be reduced in some cases.

The other electrode of the photoelectric conversion device 101 is electrically connected to a wiring 114. A gate of the transistor 102 is electrically connected to a wiring 116. The other of the source and the drain of the transistor 103 is electrically connected to a wiring 115. A gate of the transistor 103 is electrically connected to a wiring 117. The other of the source and the drain of the transistor 105 is electrically connected to a GND wiring or the like. The other of the source and the drain of the transistor 108 is electrically connected to a wiring 113. The other of the source and the drain of the transistor 106 is electrically connected to the wiring 111. A gate of the transistor 106 is electrically connected to a wiring 112. A gate of the transistor 108 is electrically connected to a wiring 122.

The wirings 114 and 115 can each have a function of a power supply line. For example, the wiring 114 can function as a high potential power supply line, and the wiring 115 can function as a low potential power supply line. The wirings 112, 116, 117, and 122 can function as signal lines for controlling the electrical conduction of the respective transistors. The wiring 111 can function as a wiring for supplying a potential corresponding to a weight coefficient to the pixel 100. The wiring 113 can function as a wiring which electrically connects the pixel 100 and the circuit 201.

The circuit 303 has a function of supplying a signal to the wiring 112. The circuit 304 has a function of supplying a signal to the wiring 122. The circuit 305 has a function of supplying a signal to the wiring 111.

Note that an amplifier circuit or a gain control circuit may be electrically connected to the wiring 113.

As the photoelectric conversion device 101, a photodiode can be used. In order to increase the light detection sensitivity under low illuminance conditions, an avalanche photodiode is preferably used.

The transistor 102 can have a function of controlling the potential of the node N. The transistor 103 can have a function of initializing the potential of the node N. The transistor 105 can have a function of controlling a current fed by the circuit 201 in accordance with the potential of the node N. The transistor 108 can have a function of selecting a pixel. The transistor 106 can have a function of supplying the potential corresponding to the weight coefficient to the node N.

Figure 3B:
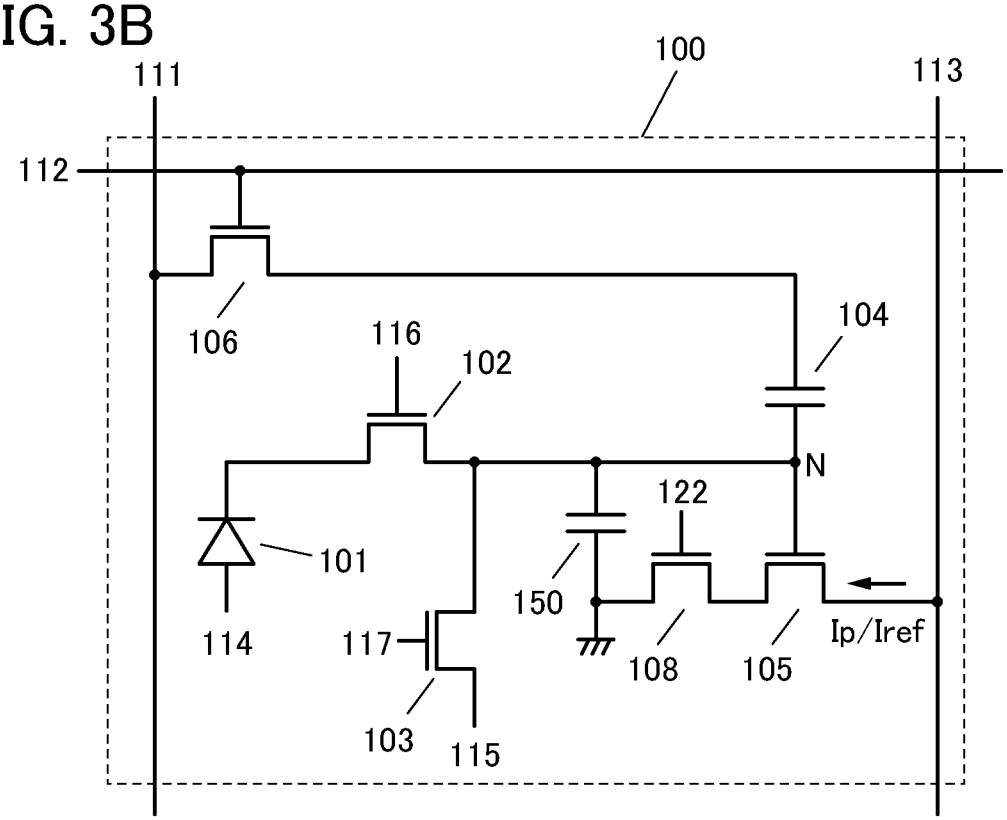

Note that as illustrated in FIG. 3B, the transistor 105 and the transistor 108 may be arranged such that the one of the source and the drain of the transistor 105 is electrically connected to the one of the source and the drain of the transistor 108, the other of the source and the drain of the transistor 105 is connected to the wiring 113, and the other of the source and the drain of the transistor 108 is electrically connected to a GND wiring or the like.

In the imaging device of one embodiment of the present invention, charges can be held at the node N for an extremely long period by an increase of the capacitance value of the capacitor 104. Therefore, a global shutter mode in which a charge accumulation operation is performed in all the pixels at the same time can be used without complicating the circuit structure and operation method. Furthermore, while image data is retained at the node N, an arithmetic operation using the image data can be performed a plurality of times.

For example, at a first time, image data is held at the node N in a predetermined pixel. At a second time when a predetermined time has passed since the first time, the image data held at the node N (hereinafter, first data) is read out, exposure is performed on the predetermined pixel, and data affected by the exposure (hereinafter, second data) is accumulated at the node N. Thus, the first data and the second data can be compared.

Note that transistors with a variety of modes can be used as the transistors used in the pixel 100. The transistor of one embodiment of the present invention preferably include silicon in a channel formation region, for example. Furthermore, the transistor may include germanium, in addition to silicon, in the channel formation region.

As a transistor used in the pixel 100, a transistor in which silicon is used for a channel formation region (hereinafter referred to as Si transistor) can be used, for example. Examples of the Si transistor include a transistor including amorphous silicon and a transistor including crystalline silicon (microcrystalline silicon, low-temperature polysilicon, or single crystal silicon).

The transistor 105 desirable has excellent amplifying characteristics. The transistors 106 and 108 are preferably transistors having a high mobility to be capable of high-speed operation because the transistors 106 and 108 are repeatedly turned on and off at frequent intervals. Accordingly, it is particularly preferable that the transistors 105, 106, and 108 are Si transistors.

Note that the transistor used in the imaging device of one embodiment of the present invention may be a transistor including a metal oxide such as In, Zn, and M (M is Al, Ti, Ga, Ge, Sn, Y, Zr, La, Ce, Nd, or Hf) in a channel formation region (the transistor is hereinafter referred to as OS transistor). The OS transistor is preferably formed over an insulating layer over a substrate, for example. In addition, the OS transistor can be provided to be stacked with a Si transistor, for example. A gate, a source region, and a drain region of the OS transistor are, for example, provided apart from a transistor formed on a silicon substrate, a capacitor, and the like with an insulating layer and are electrically connected to the transistor, the capacitor, and the like through a conductive layer provided in the insulating layer.

The potential of the node N in the pixel 100 is determined by capacitive coupling between a potential obtained by adding a reset potential supplied from the wiring 115 and a potential (image data) generated by photoelectric conversion by the photoelectric conversion device 101 and the potential corresponding to a weight coefficient supplied from the wiring 111. That is, a current corresponding to data including a product of a predetermined weight coefficient and the image data flows through the transistor 105.

As illustrated in FIG. 2, the pixels 100 are electrically connected to each other through the wiring 113. The circuit 201 can perform an arithmetic operation using the sum of the currents flowing through the transistors 105 of the pixels 100.

The circuit 201 includes a capacitor 202, a transistor 203, a transistor 204, a transistor 205, a transistor 206, and a resistor 207.

One of electrodes of the capacitor 202 is electrically connected to one of a source and a drain of the transistor 203. The one of the source and the drain of the transistor 203 is electrically connected to a gate of the transistor 204. One of a source and a drain of the transistor 204 is electrically connected to one of a source and a drain of the transistor 205. The one of the source and the drain of the transistor 205 is electrically connected to one of a source and a drain of the transistor 206. One of electrodes of the resistor 207 is electrically connected to the other electrode of the capacitor 202.

The other electrode of the capacitor 202 is electrically connected to the wiring 113. The other of the source and the drain of the transistor 203 is electrically connected to a wiring 218. The other of the source and the drain of the transistor 204 is electrically connected to a wiring 219. The other of the source and the drain of the transistor 205 is electrically connected to a reference power supply line such as a GND wiring. The other of the source and the drain of the transistor 206 is electrically connected to a wiring 212. The other electrode of the resistor 207 is electrically connected to a wiring 217. A gate of the transistor 203 is electrically connected to a wiring 216. A gate of the transistor 205 is electrically connected to a wiring 215. A gate of the transistor 206 is electrically connected to a wiring 213.

The wirings 217, 218, and 219 can each have a function of a power supply line. For example, the wiring 218 can have a function of a wiring which supplies a potential dedicated to reading. The wirings 217 and 219 can function as high potential power supply lines. The wirings 213, 215, and 216 can function as signal lines for controlling the electrical conduction of the respective transistors. The wiring 212 is an output line and can be electrically connected to the circuit 301 illustrated in FIG. 1, for example.

The transistor 203 can have a function of resetting the potential of the wiring 211 to the potential of the wiring 218. The transistors 204 and 205 can function as source follower circuits. The transistor 206 can have a function of controlling a reading operation.

In one embodiment of the present invention, offset components other than the product of image data (potential X) and a weight coefficient (potential W) are eliminated and WX that is objective data is extracted. WX can be calculated using data obtained from a pixel when imaging is performed and when data obtained when imaging is not performed, and using data obtained by supplying weights to the respective data.

The total amount of the currents (Ip) flowing through the pixels 100 when imaging is performed is $k\Sigma(X-V_{th})^2$, and the total amount of the currents (Ip) flowing through the pixels 100 when weights are supplied is $k\Sigma(W+X-V_{th})^2$. The total amount of the currents (Iref) flowing through the pixels 100 when imaging is not performed is $k\Sigma(0-V_{th})^2$, and the total amount of currents (Iref) flowing through the pixels 100 when weights are supplied is $k\Sigma(W-V_{th})^2$. Here, k is a constant and $V_{th}$ is the threshold voltage of the transistor 105.

First, a difference (data A) between the data obtained when image capturing is performed and the data obtained by adding weights to the data is calculated. The difference is $k\Sigma((X-V_{th})^2-(W+X-V_{th})^2)=k\Sigma(-W^2-2W\cdot X+2W\cdot V_{th})$.

Next, a difference (data B) between the data obtained when image capturing is not performed and the data obtained by adding weights to the data is calculated. The difference is $k\Sigma((0-V_{th})^2-(W-V_{th})^2)=k\Sigma(-W^2+2W\cdot V_{th})$.

Then, a difference between the data A and the data B is calculated. The difference is $k\Sigma(-W^2-2W\cdot X+2W\cdot V_{th}-(-W^2+2W\cdot V_{th}))=k\Sigma(-2W\cdot X)$. That is, offset components other than the product of the image data (X) and the weight coefficient (W) can be eliminated.

The circuit 201 can read out the data A and the data B. Note that the calculation of the difference between the data A and the data B can be performed by the circuit 301.

Figure 4A:
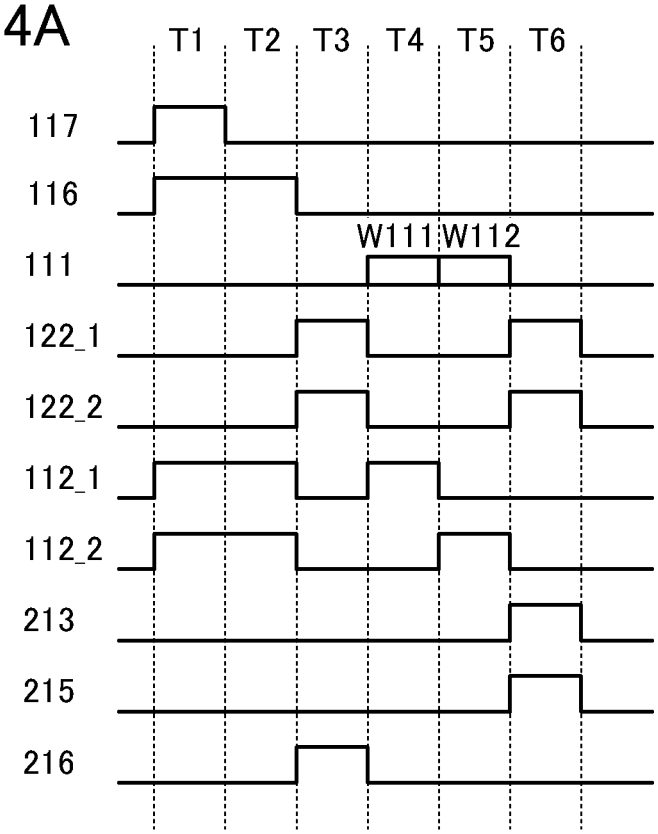
FIG. 4A and FIG. 4B are each a timing chart illustrating operations of the pixel block 200 and the circuit 201.

FIG. 4A is a timing chart illustrating an operation of calculating the difference (data A) between the data obtained when image capturing is performed and the data obtained by adding weights to the data in the pixel block 200 and the circuit 201. For convenience, the timings of changing signals are matched in the chart; however, in reality, the timings are preferably shifted in consideration of the delay inside the circuit.

First, in a period T1, the potential of the wiring 117 is set to "H" and the potential of the wiring 116 is set to "H", so that the nodes N in the pixels 100 have reset potentials. Furthermore, the potential of the wiring 111 is set to "L" and wirings 112_1 and 112_2 (the wirings 112 in the first and second rows) are set to "H", so that weight coefficients 0 are written.

In a period T2, the potential of the wiring 116 is kept at "H" and the potential of the wiring 117 is set to "L", so that the potential X (image data) is written to the nodes N by photoelectric conversion of the photoelectric conversion devices 101.

In a period T3, the potentials of wirings 122_1 and 122_2 are set to "H", so that all of the pixels 100 in the pixel block are selected. At this time, a current corresponding to the potential X flows to the transistor 105 in each of the pixels 100. The wiring 216 is set to "H", so that a potential Vr of the wiring 218 is written to the wiring 211. The operation in the periods T1 to T3 corresponds to obtainment of the data obtained when imaging is performed, and the data is represented by the potential Vr of the wiring 211.

In a period T4, the potential of the wiring 111 is set to a potential corresponding to a weight coefficient W111 (a weight added to the pixels in the first row), and the potential of the wiring 112_1 is set to "H", so that the weight coefficient W111 is added to the nodes N of the pixels 100 in the first row by capacitive coupling of the capacitors 104.

In a period T5, the potential of the wiring 111 is set to a potential corresponding to a weight coefficient W112 (a weight added to the pixels in the second row), and the potential of the wiring 112_2 is set to "H", so that the weight coefficient W112 is added to the nodes N of the pixels 100 in the second row by capacitive coupling of the capacitors 104. The operation in the periods T4 and T5 corresponds to generation of data in which weights are added to the data obtained when imaging is performed.

In a period T6, the potentials of the wirings 122_1 and 122_2 are set to "H", so that all of the pixels 100 in the pixel block are selected. At this time, a current corresponding to the potential W111+X flows to the transistors 105 in the pixels 100 in the first row. A current corresponding to the potential W112+X flows to the transistors 105 in the pixels 100 in the second row. Here, the potential of the other electrode of the capacitor 202 changes in accordance with the current flowing through the wiring 113, and an amount Y of change is added to the potential Vr of the wiring 211 by capacitive coupling. Accordingly, the potential of the wiring 211 becomes "Vr+Y". Here, given that Vr=0, Y is the difference itself, which means that the data A is calculated.

Furthermore, the wiring 213 and the wiring 215 are set to "H", so that the circuit 201 can output a signal potential corresponding to the data A of the pixel blocks 200 in the first row by a source follower operation.

Figure 4B:
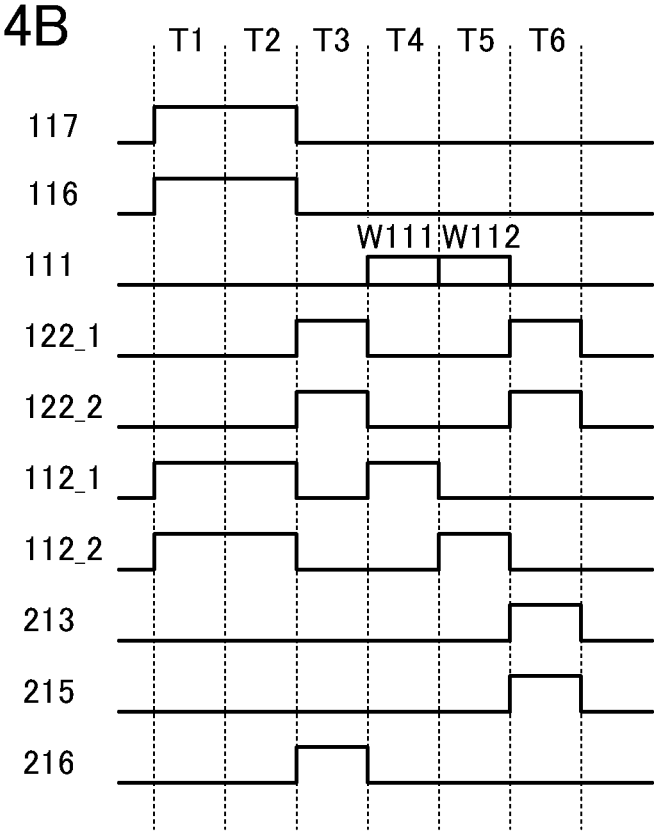

FIG. 4B is a timing chart illustrating an operation of calculating the difference (data B) between the data obtained when imaging is not performed and the data obtained by adding the weight to the data in the pixel blocks 200 and the circuit 201. Although an operation of consecutively obtaining the data B from the pixel blocks 200 is described here, the obtainment of the data B and the obtainment of the data A shown in FIG. 4 may be alternately performed. Alternatively, the data A may be obtained after the data B is obtained.

First, in the periods T1 and T2, the potential of the wiring 117 is set to "H" and the potential of the wiring 116 is set to "H", so that the nodes N in the pixels 100 have reset potentials (0). At the end of the period T2, the potential of the wiring 117 is set to "L" and the potential of the wiring 116 is set to "L". That is, in the periods, the potentials of the nodes N are the reset potentials regardless of the operation of the photoelectric conversion devices 101.

In addition, in the period T1, the potential of the wiring 111 is set to "L" and the wirings 112_1 and 112_2 are set to "H", so that weight coefficients 0 are written. This operation is performed during a period in which the potentials of the nodes N are the reset potentials.

In a period T3, the potentials of wirings 122_1 and 122_2 are set to "H", so that all of the pixels 100 in the pixel block are selected. At this time, a current corresponding to the reset potential flows to the transistor 105 in each of the pixels 100. The wiring 216 is set to "H", so that a potential Vr of the wiring 218 is written to the wiring 211. The operation in the periods T1 to T3 corresponds to obtainment of the data obtained when imaging is not performed, and the data is represented by the potential Vr of the wiring 211.

In a period T4, the potential of the wiring 111 is set to a potential corresponding to a weight coefficient W111 (a weight added to the pixels in the first row), and the potential of the wiring 112_1 is set to "H", so that the weight coefficient W111 is added to the nodes N of the pixels 100 in the first row by capacitive coupling of the capacitors 104.

In a period T5, the potential of the wiring 111 is set to a potential corresponding to a weight coefficient W112 (a weight added to the pixels in the second row), and the potential of the wiring 112_2 is set to "H", so that the weight coefficient W112 is added to the nodes N of the pixels 100 in the second row by capacitive coupling of the capacitors 104. The operation in the periods T4 and T5 corresponds to generation of data in which weights are added to the data obtained when imaging is not performed.

In a period T6, the potentials of the wirings 122_1 and 122_2 are set to "H", so that all of the pixels 100 in the pixel block are selected. At this time, a current corresponding to the potential W111+0 flows to the transistors 105 in the pixels 100 in the first row. A current corresponding to the potential W112+0 flows to the transistors 105 in the pixels 100 in the first row. Here, the potential of the other electrode of the capacitor 202 changes in accordance with the current flowing through the wiring 113, and the amount Y of change is added to the potential Vr of the wiring 211. Accordingly, the potential of the wiring 211 becomes "Vr+Y". Here, given that Vr=0, Y is the difference itself, which means that the data B is calculated.

Furthermore, the wiring 213 and the wiring 215 are set to "H", so that the circuit 201 can output a signal potential corresponding to the data B of the pixel blocks 200 in the first row by a source follower operation.

The data A and the data B output from the circuit 201 in the above operations are input to the circuit 301. Calculation of the difference between the data A and the data B is performed in the circuit 301, so that unnecessary offset components other than the product of the image data (potential X) and the weight coefficient (potential W) can be eliminated. The circuit 301 may have a structure in which the difference is calculated by utilizing a memory circuit and software processing, other than the structure including an arithmetic circuit such as the circuit 201.

The circuit 301 may include an analog-digital conversion circuit. For example, data supplied to the circuit 301, e.g., the data A and the data B may be converted into digital values and stored in the memory circuit, whereby calculation may be performed.

In the case where the multiplication of image data (potential X) and weight coefficient (potential W) is not performed, the operation of the period T4 and the operation of the period T5 illustrated in FIG. 4A and FIG. 4B are not necessarily performed. For example, the wiring 111 may be kept at "L".

Figure 5A:
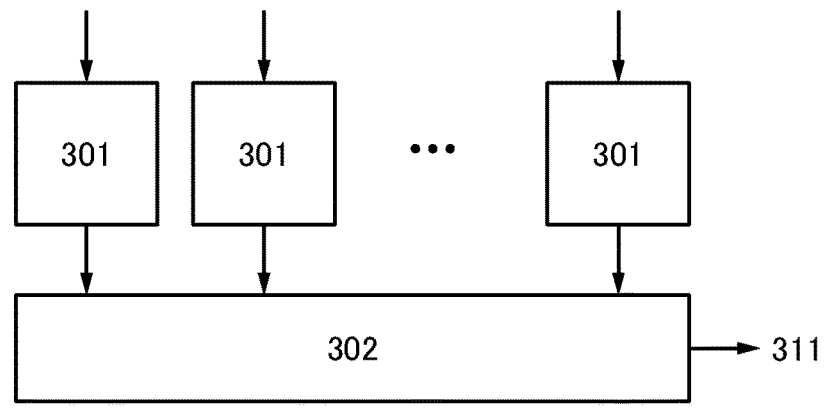
FIG. 5A and FIG. 5B are diagrams illustrating circuits 301 and a circuit 302.

FIG. 5A is a diagram illustrating the circuit 302 and the circuits 301 connected to the circuit 201. Product-sum operation result data output from the circuit 201 is sequentially input to the circuits 301. The circuits 301 may each have a variety of arithmetic functions in addition to the above-described function of calculating the difference between the data A and the data B. For example, the circuits 301 can have a structure similar to that of the circuit 201. Alternatively, the function of the circuits 301 may be replaced by software processing.

The circuits 301 may each include a circuit that performs an arithmetic operation of an activation function. A comparator circuit can be used as the circuit, for example. A comparator circuit outputs a result of comparing input data and a set threshold as binary data. In other words, the pixel blocks 200, the circuit 201, and the circuits 301 can operate as part of elements in a neural network.

Furthermore, in the case where the data output from the pixel blocks 200, which corresponds to image data of a plurality of bits, can be binarized by the circuits 301, the binarization can be rephrased as compression of image data.

Data output from the circuits 301 is sequentially input to the circuit 302. The circuit 302 can have a structure including a latch circuit, a shift register, and the like, for example. With this structure, parallel-serial conversion can be performed and data input in parallel can be output to the wiring 311 as serial data. The connection destination of the wiring 311 is not limited. For example, it can be connected to a neural network, a memory device, a communication device, or the like.

Figure 5B:
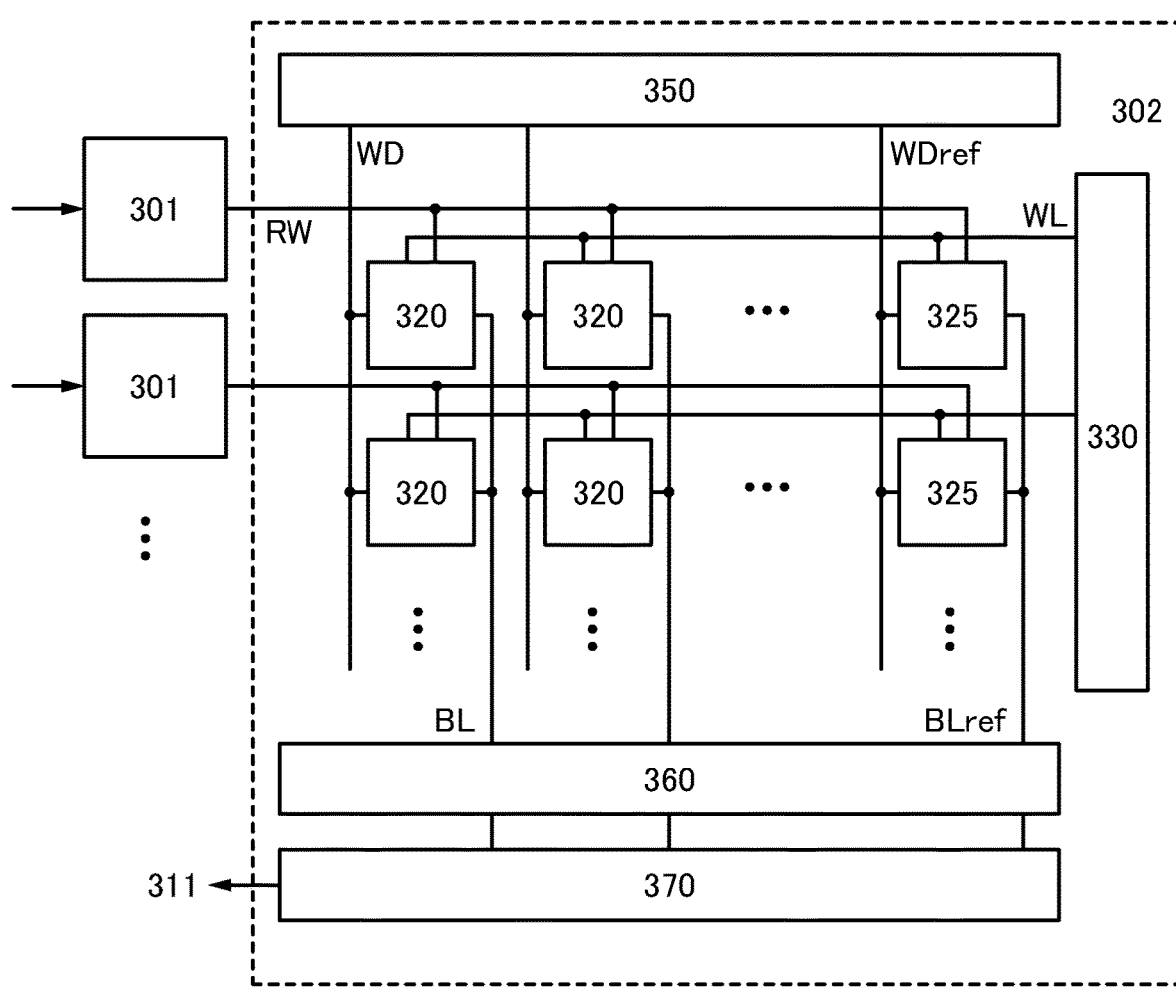

Moreover, as illustrated in FIG. 5B, the circuit 302 may include a neural network. The neural network includes memory cells arranged in a matrix, and each memory cell retains a weight coefficient. Data output from the circuits 301 is input to corresponding memory cells 320, and a product-sum operation can be performed. Note that the number of memory cells illustrated in FIG. 5B is an example, and the number is not limited.

The neural network illustrated in FIG. 5B includes the memory cells 320 and reference memory cells 325 which are arranged in a matrix, a circuit 330, a circuit 350, a circuit 360, and a circuit 370.

Figure 6:
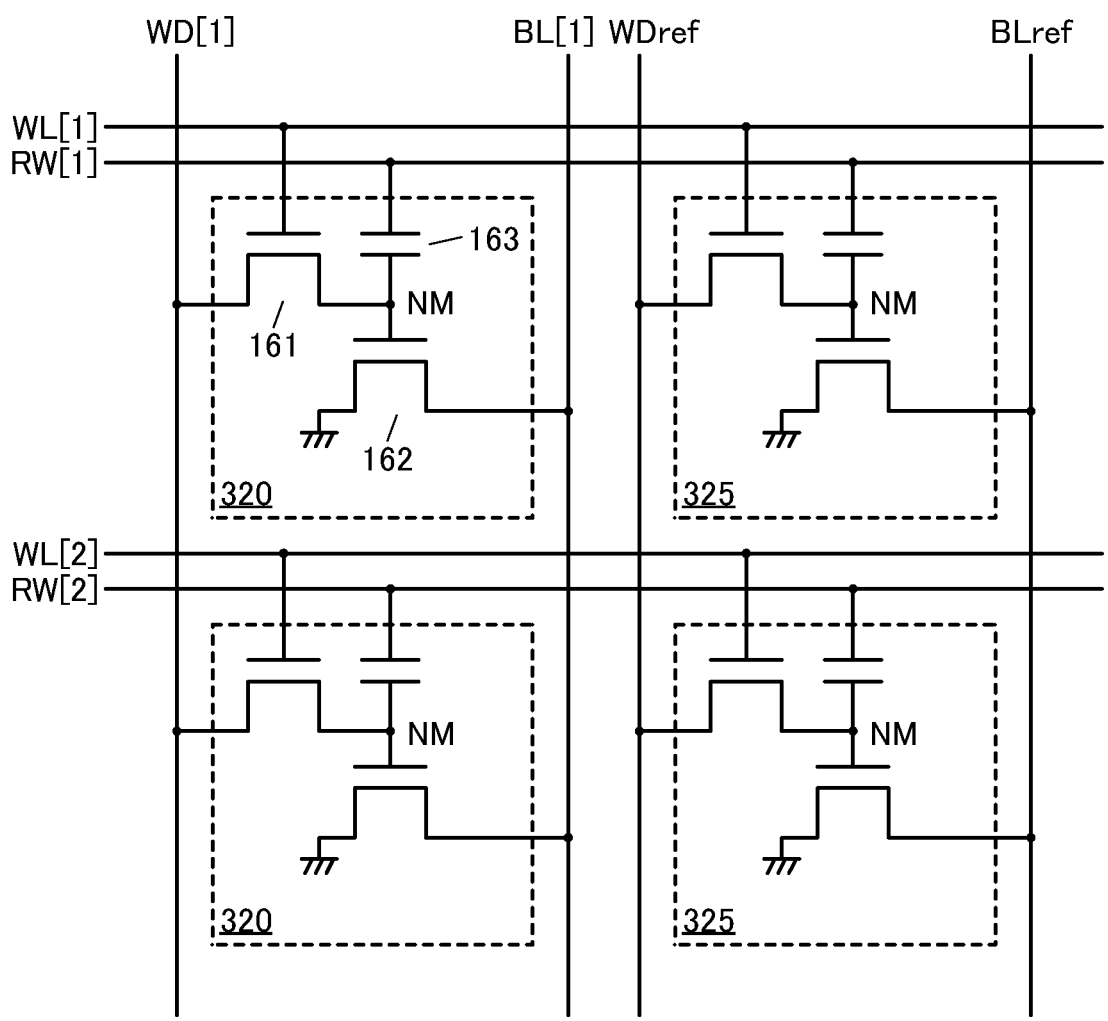
FIG. 6 is a diagram illustrating a pixel included in the circuit 302.

FIG. 6 illustrates an example of the memory cells 320 and the reference memory cells 325. The reference memory cells 325 are provided in an arbitrary one column. The memory cells 320 and the reference memory cells 325 have similar structures and each include a transistor 161, a transistor 162, and a capacitor 163.

One of a source and a drain of the transistor 161 is electrically connected to a gate of the transistor 162. The gate of the transistor 162 is electrically connected to one of electrodes of the capacitor 163. Here, a point where the one of the source and the drain of the transistor 161, the gate of the transistor 162, and the one of electrodes of the capacitor 163 are connected is referred to as a node NM.

A gate of the transistor 161 is electrically connected to a wiring WL. The other electrode of the capacitor 163 is electrically connected to a wiring RW. One of a source and a drain of the transistor 162 is electrically connected to a reference potential wiring such as a GND wiring.

In the memory cell 320, the other of the source and the drain of the transistor 161 is electrically connected to a wiring WD. The other of the source and the drain of the transistor 162 is electrically connected to a wiring BL.

In the reference memory cell 325, the other of the source and the drain of the transistor 161 is electrically connected to a wiring WDref. The other of the source and the drain of the transistor 162 is electrically connected to a wiring BLref.

The wiring WL is electrically connected to the circuit 330. As the circuit 330, a decoder, a shift register, or the like can be used.

The wiring RW is electrically connected to the circuit 301. Binary data output from the circuit 301 is written to each memory cell.

The wiring WD and the wiring WDref are electrically connected to the circuit 350. As the circuit 350, a decoder, a shift register, or the like can be used. The circuit 350 may include a D/A converter or an SRAM. The circuit 350 can output a weight coefficient to be written to the node NM.

The wiring BL and the wiring BLref are electrically connected to the circuit 360 and the circuit 370. The circuit 360 is a current source circuit, and the circuit 370 can have a structure equivalent to that of the circuit 201. By the circuit 360 and the circuit 370, a signal of a product-sum operation result from which offset components are eliminated can be obtained.

The circuit 360 is electrically connected to the circuit 370. The circuit 370 can also be referred to as an activation function circuit. The activation function circuit has a function of performing an arithmetic operation for converting the signal input from the circuit 360 in accordance with a predefined activation function. As the activation function, for example, a sigmoid function, a tanh function, a softmax function, a ReLU function, a threshold function, or the like can be used. The signal converted by the activation function circuit is output to the outside as output data.

Figure 7A:
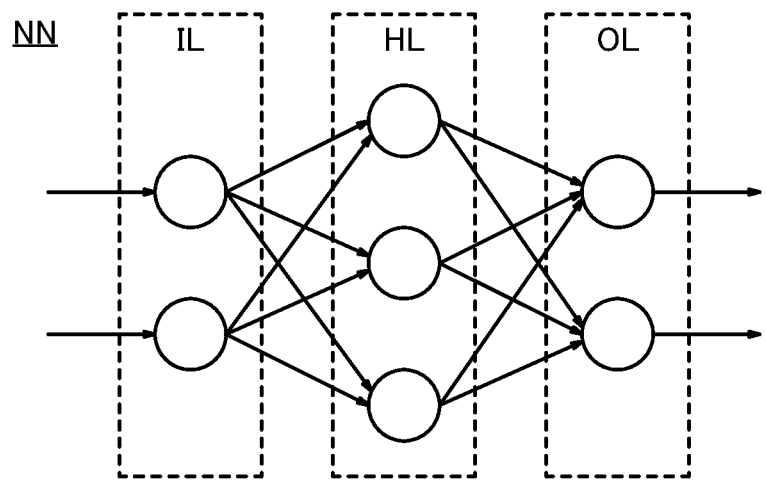
FIG. 7A and FIG. 7B are diagrams showing structure examples of neural networks.

As illustrated in FIG. 7A, a neural network NN can be formed of an input layer IL, an output layer OL, and a middle layer (hidden layer) HL. The input layer IL, the output layer OL, and the middle layer HL each include one or more neurons (units). Note that the middle layer HL may be composed of one layer or two or more layers. A neural network including two or more middle layers HL can also be referred to as a DNN (deep neural network). Learning using a deep neural network can also be referred to as deep learning.

Input data is input to each neuron in the input layer IL. A signal output from a neuron in the previous layer or the subsequent layer is input to each neuron in the middle layer HL. To each neuron in the output layer OL, output signals of the neurons in the previous layer are input. Note that each neuron may be connected to all the neurons in the previous and subsequent layers (full connection), or may be connected to some of the neurons.

Figure 7B:
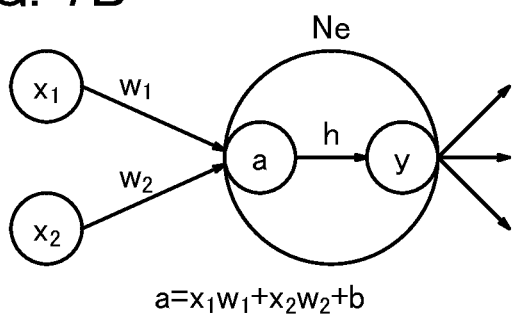

FIG. 7B shows an example of an operation with the neurons. Here, a neuron Ne and two neurons in the previous layer which output signals to the neuron Ne are illustrated. An output $x_1$ of a neuron in the previous layer and an output $x_2$ of a neuron in the previous layer are input to the neuron Ne. Then, in the neuron Ne, a total sum $x_1w_1+x_2w_2$ of a multiplication result ($x_1w_1$) of the output $x_1$ and a weight $w_1$ and a multiplication result ($x_2w_2$) of the output $x_2$ and a weight $w_2$ is calculated, and then a bias b is added as necessary, so that the value $a=x_1w_1+x_2w_2+b$ is obtained. Then, the value a is converted with an activation function h, and an output signal $y=h(a+b)$ is output from the neuron Ne.

In this manner, the arithmetic operation with the neurons includes the arithmetic operation that sums the products of the outputs and the weights of the neurons in the previous layer, that is, the product-sum operation ($x_1w_1+x_2w_2$ described above). This product-sum operation may be performed using a program on software or may be performed using hardware.

In one embodiment of the present invention, an analog circuit is used as hardware to perform a product-sum operation. In the case where an analog circuit is used as the product-sum operation circuit, the circuit scale of the product-sum operation circuit can be reduced, or higher processing speed and lower power consumption can be achieved by reduced frequency of access to a memory.

Figure 8:
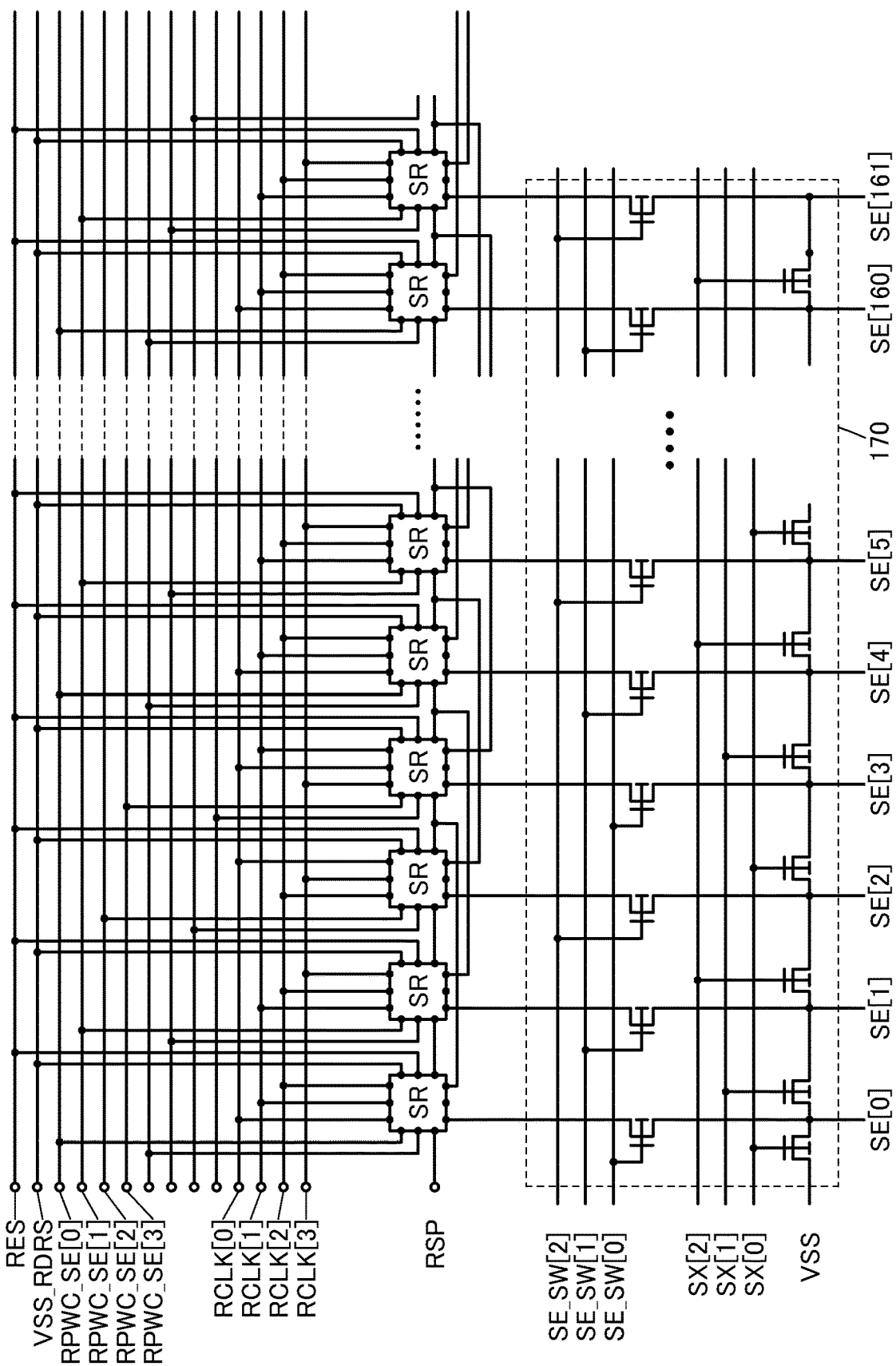
FIG. 8 is a diagram illustrating a circuit 304.

FIG. 8 illustrates an example of a circuit that can be used as the circuit 304. The circuit is a shift register circuit, in which a plurality of logic circuits (SR) are electrically connected. To the logic circuits (SR), signal lines such as a wiring RES, a wiring VSS_RDRS, wirings RPWC_SE[0:3], wirings RCLK[0:3], and a wiring RSP are connected and appropriate signal potentials are input to the respective signal lines, so that selection signal potentials can be sequentially output from the logic circuits (SR).

A circuit 170 is electrically connected to the logic circuits (SR). A plurality of transistors are provided in the circuit 170 and are connected to signal lines such as wirings SE_SW[0:2] and wirings SX[0:2]. When appropriate signal potentials are input to the respective signal lines, electrical conduction of the transistors is controlled. By the control by the circuit 170, the number of rows of pixels to be selected can be changed.

One of a source and a drain of one transistor is electrically connected to an output terminal of one logic circuit (SR), and the other of the source and the drain of the transistor is connected to the wiring SE. The wiring SE is electrically connected to the wiring 122 for selecting the pixel 100.

A signal potential supplied from the wiring SE_SW[0] can be input to a gate of the transistor connected to the wiring SE[0]. A signal potential supplied from the wiring SE_SW[1] can be input to a gate of the transistor connected to the wiring SE[1]. A signal potential supplied from the wiring SE_SW[2] can be input to a gate of the transistor connected to the wiring SE[2]. Signal potentials supplied from the wirings SE_SW[0:2] can be input to gates of the transistors connected to the wirings SE after the wirings SE[3] in the same order.

Moreover, adjacent wirings SE are electrically connected to each other through one transistor, and the wiring SE[0] is electrically connected to a power supply line (VSS) through one transistor.

A signal potential supplied from the wiring SX[0] can be input to a gate of the transistor that electrically connects the power supply line (VSS) and the wiring SE[0]. A signal potential supplied from the wiring SX[1] can be input to a gate of the transistor that electrically connects the wiring SE[0] and the wiring SE[1]. A signal potential supplied from the wiring SX[2] can be input to a gate of the transistor that electrically connects the wiring SE[1] and the wiring SE[2]. Signal potentials supplied from the wirings SE_SX[0:2] can be input to gates of the transistors that electrically connect the subsequent adjacent wirings SE in the same order.

Figure 9:
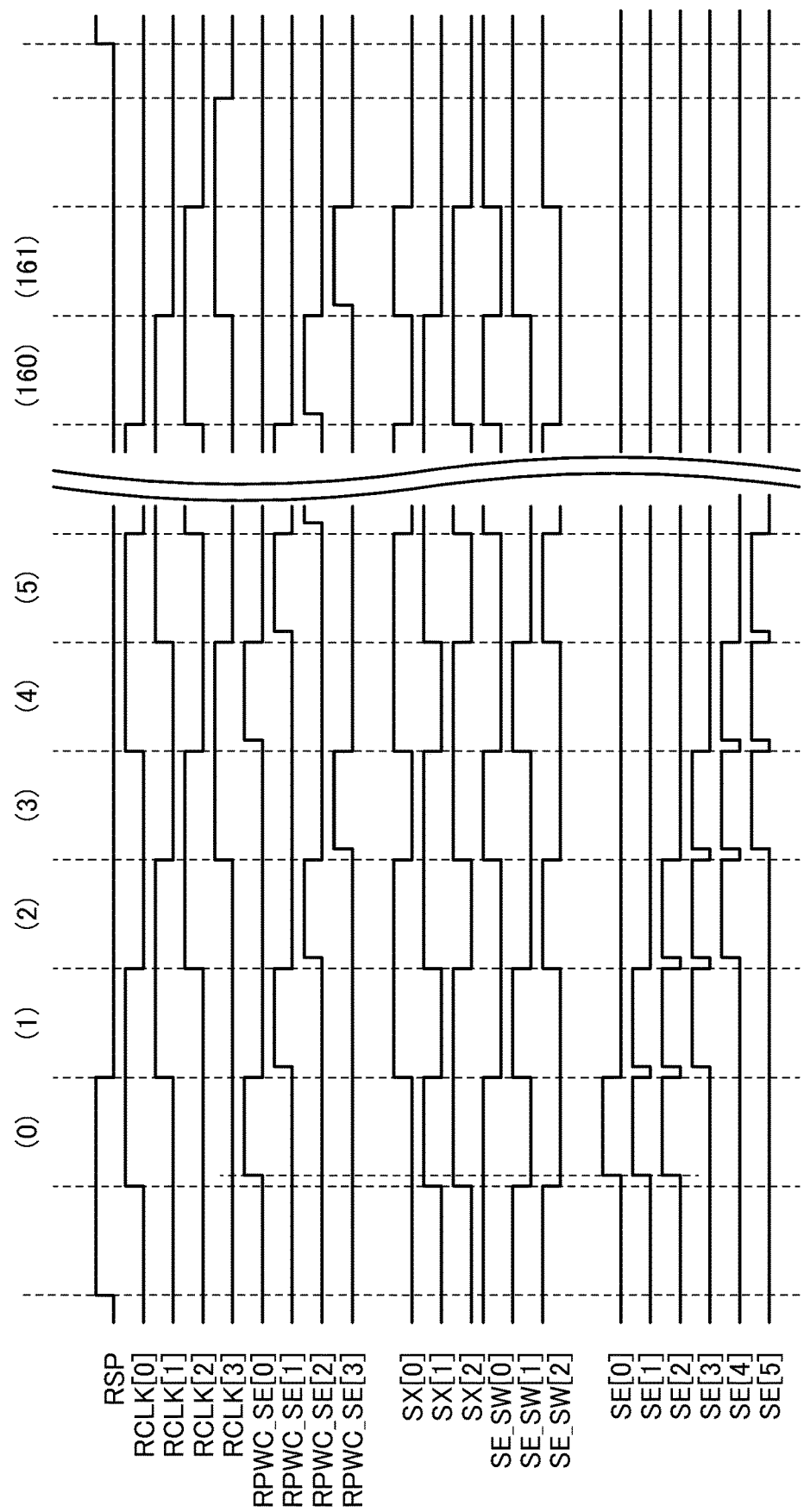
FIG. 9 is a timing chart illustrating operation of the circuit 304.

FIG. 9 is a timing chart illustrating an operation in which a plurality of rows (three rows) are selected at a time by the circuit illustrated in FIG. 8. Note that (0) to (161) correspond to timings at which the logic circuits (SR) output signal potentials to the wirings SE.

When the potential of the wiring SX[0] is "L", the potential of the wiring SX[1] is "H", the potential of the wiring SX[2] is "H", the potential of the wiring SE_SW[0] is "H", the potential of the wiring SE_SW[1] is "L", and the potential of the wiring SE_SW[2] is "L" at the timing (0), electrical conduction of the respective transistors is controlled and "H", "H", and "H" are output to the wiring SE[0], the wiring SE[1], and the wiring SE[2], respectively. To the other wirings SE, "L" is output.

Thus, three rows can be selected at a time, and a product-sum operation of pixels of three rows and three columns can be performed, for example.

When the potential of the wiring SX[0] is "H", the potential of the wiring SX[1] is "L", the potential of the wiring SX[2] is "H", the potential of the wiring SE_SW[0] is "L", the potential of the wiring SE_SW[1] is "H", and the potential of the wiring SE_SW[2] is "L" at the timing (1), electrical conduction of the respective transistors is controlled and "L", "H", "H", and "H" are output to the wiring SE[0], the wiring SE[1], the wiring SE[2], and the wiring SE[3], respectively. To the other wirings SE, "L" is output.

That is, at the timing (1), a product-sum operation with a stride of 1, in which one-row shift from the timing (0) is made, can be performed.

Figure 10:
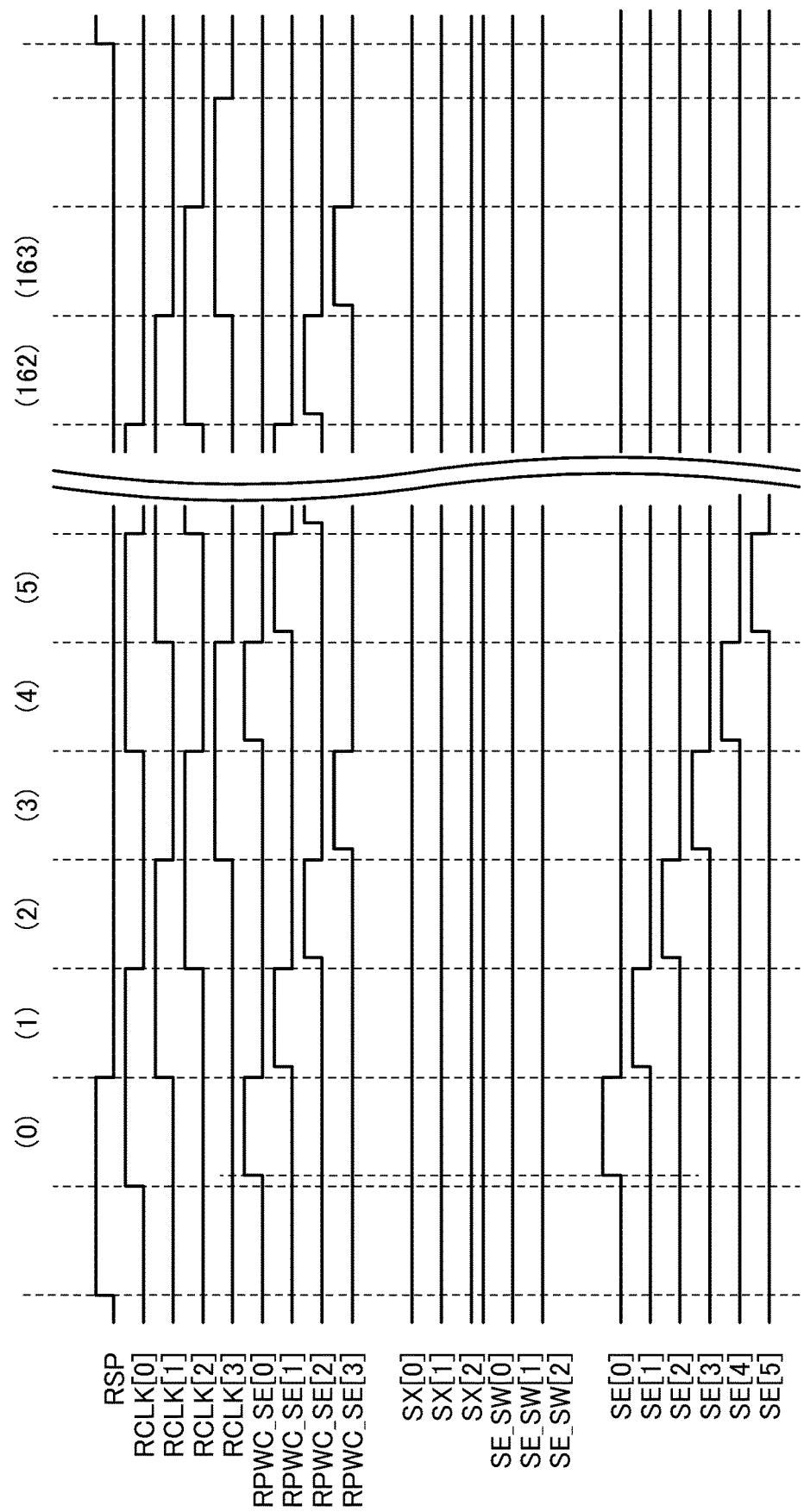
FIG. 10 is a timing chart illustrating operation of the circuit 304.

FIG. 10 is a timing chart illustrating an operation in which one row is selected by the circuit illustrated in FIG. 8.

In the operation in accordance with the timing chart, the potentials of the wirings SE_SW[0:2] always remain at "H", and the potentials of the wirings SX[0:2] always remain at "L". Thus, outputs of the logic circuits (SR) are input to the respective wirings SE without any changes, which enables selection of one row at a time.

As an imaging method that can be used for the imaging device of one embodiment of the present invention, a rolling shutter system and a global shutter system are described.

Figure 11A:
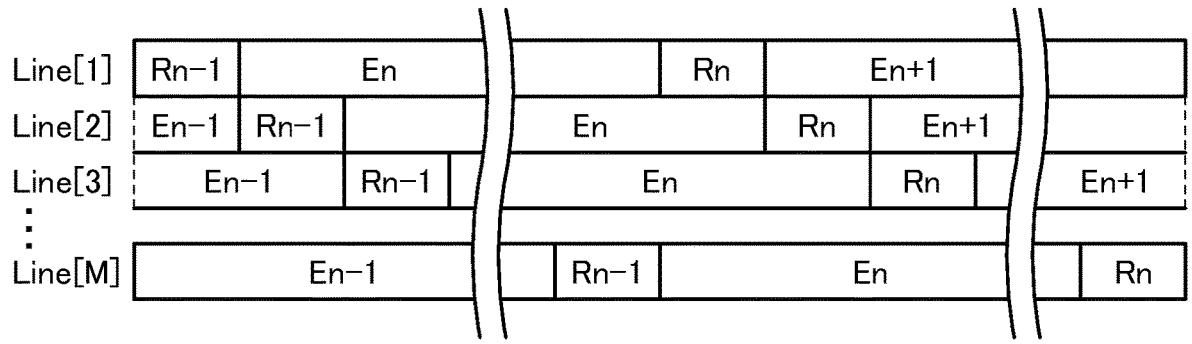
FIG. 11A is a diagram illustrating a rolling shutter operation.
Figure 11B:
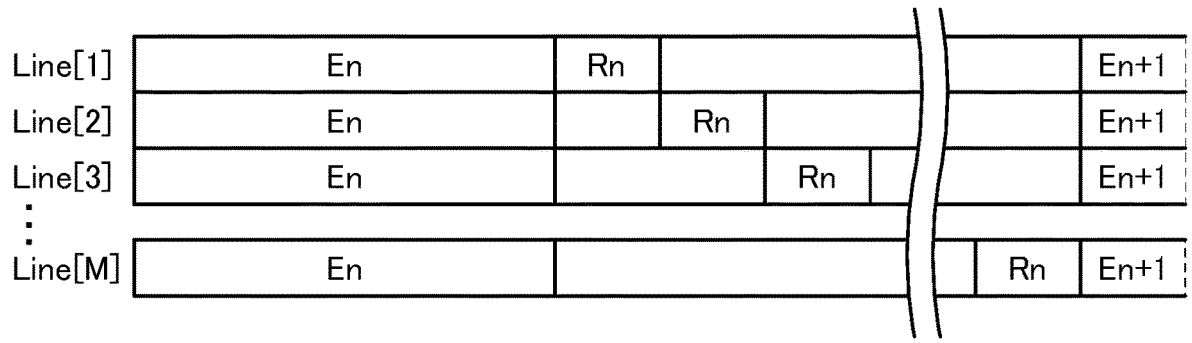
FIG. 11B is a diagram illustrating a global shutter operation.

FIG. 11A is a schematic view of the operation method with a rolling shutter system, and FIG. 11B is a schematic view of a global shutter system. Note that En denotes exposure (accumulation operation) in the n-th column (n is a natural number), and Rn denotes reading operation in the n-th column. FIG. 11A and FIG. 11B show operation from the first row to the M-th row (M is a natural number).

The rolling shutter system is an operation mode in which exposure and data reading are performed sequentially and a reading period of a row overlaps with an exposure period of another row. The reading operation is performed right after the exposure, so that images can be taken even with a circuit structure having a relatively short data retention period. However, an image of one frame is composed of data that does not have simultaneity of imaging; therefore, distortion is caused in an image when imaging of a moving object is performed.

On the other hand, the global shutter system is an operation mode in which exposure is performed on all the pixels at the same time, data is retained in each pixel, and data reading is performed row by row. Thus, an undistorted image can be obtained even when imaging of a moving object is performed.

The imaging device of one embodiment of the present invention enables fluctuation of data potentials accumulated in pixels by exposure to be extremely small when the capacitance values of capacitors such as the capacitor 104 illustrated in FIG. 3A and FIG. 3B are increased. The data retention time can be prolonged, which facilitates achievement of a global shutter system. Note that the imaging device of one embodiment of the present invention can also operate with the rolling shutter system.

In FIG. 11A and FIG. 11B, Line[m] (m is a natural number greater than or equal to 1 and less than or equal to M) may denote the pixels 100 in the m-th row, En may denote exposure performed on the pixels 100 in the n-th row, and Rn may denote the reading operation in the pixels 100 in the n-th row. Alternatively, Line[m] (m is a natural number greater than or equal to 1 and less than or equal to M) may denote the pixel blocks 200 in the m-th row, En may denote exposure performed on the pixel blocks 200 in the n-th row, and Rn may denote the reading operation in the n-th row.

Figure 11C:
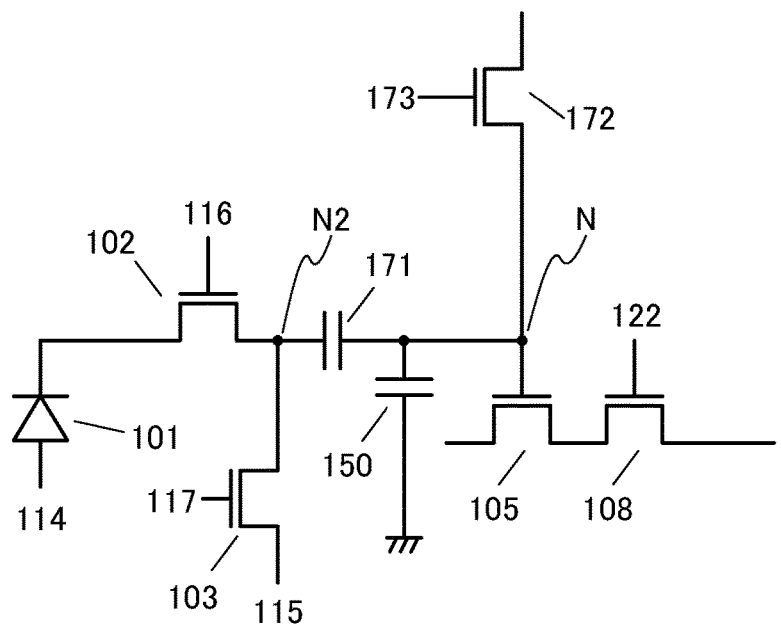
FIG. 11C is an example of a pixel.

The imaging device of one embodiment of the present invention may include a pixel illustrated in FIG. 11C.

The pixel illustrated in FIG. 11C includes the photoelectric conversion device 101, the transistor 102, the transistor 103, a capacitor 171, the capacitor 150, the transistor 105, the transistor 108, and a transistor 172. A signal from the photoelectric conversion device 101 is supplied to one of a source and a drain of the transistor 102, and the other of the source and the drain of the transistor 102 is electrically connected to one of a source and a drain of the transistor 103 and a node N2. The other of the source and the drain of the transistor 103 is electrically connected to the wiring 115, the node N2 is electrically connected to one of electrodes of the capacitor 171, and the other electrode of the capacitor 171 is electrically connected to the node N. A gate of the transistor 102 is electrically connected the wiring 116. A gate of the transistor 103 is electrically connected to the wiring 117. A gate of the transistor 105 is electrically connected to the node N. A gate of the transistor 108 is electrically connected to the wiring 122. A gate of the transistor 172 is electrically connected to a wiring 173.

In FIG. 11C, the node N is electrically connected to one of electrodes of the capacitor 150, a gate of the transistor 105, one of a source and a drain of the transistor 172.

At the first time, a signal for turning on the transistor 102 is supplied from the wiring 116 to the gate of the transistor 102, and a signal from the photoelectric conversion device 101 is supplied to the node N2. The potential of the node N2 changes depending on a supplied signal to be a potential V1 [V]. A signal for turning on the transistor 172 is supplied from the wiring 173 to the gate of the transistor 172, so that a reference potential is supplied to the node N. Here, 0 [V] is supplied as the reference potential.

At the second time, a signal for turning off the transistor 102 is supplied from the wiring 116 to the gate of the transistor 102. A signal for turning off the transistor 172 is supplied from the wiring 173 to the gate of the transistor 172. A signal for turning off the transistor 103 is supplied from the wiring 117 to the gate of the transistor 103, so that a reference potential is supplied to the node N2. Here, VDD [V] is supplied as the reference potential, and the potential of the node N2 is increased from the potential V1 [V] to VDD [V]. In response to the change in the potential of the node N2, the potential of the node N is increased from 0 V to VDD-V1 [V] by capacitive coupling.

At the third time, a signal for turning off the transistor 103 is supplied form the wiring 117 to the gate of the transistor 103. A signal for turning off the transistor 172 is supplied from the wiring 173 to the gate of the transistor 172. A signal for turning on the transistor 102 is supplied from the wiring 116 to the gate of the transistor 102, so that a signal from the photoelectric conversion device 101 is supplied to the node N2. The potential of the node N2 comes to a potential V2 [V]. The potential of the node N is decreased to (V2−V1) [V] by capacitive coupling. In other words, a difference between the signal from the photoelectric conversion device 101 at the first time and the signal from the photoelectric conversion device 101 at the third time is supplied to the node N.

Thus, in the pixel illustrated in FIG. 11C, a difference between signals at two times can be calculated and output. The image captured at the first time is a reference image, the image captured at the third time is an image for comparison, and the two images are compared, so that motion detection can be performed.

This embodiment can be combined with any of the other embodiments and examples as appropriate.

Embodiment 2

In this embodiment, structure examples and the like of the imaging device of one embodiment of the present invention will be described.

Figure 12A:
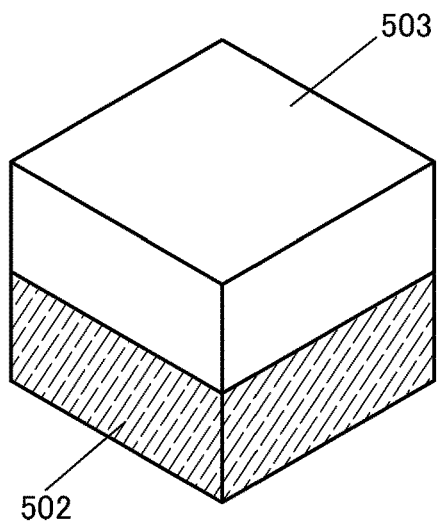
FIGS. 12A to 12F are diagrams illustrating structures of a pixel of an imaging device.
Figure 12B:
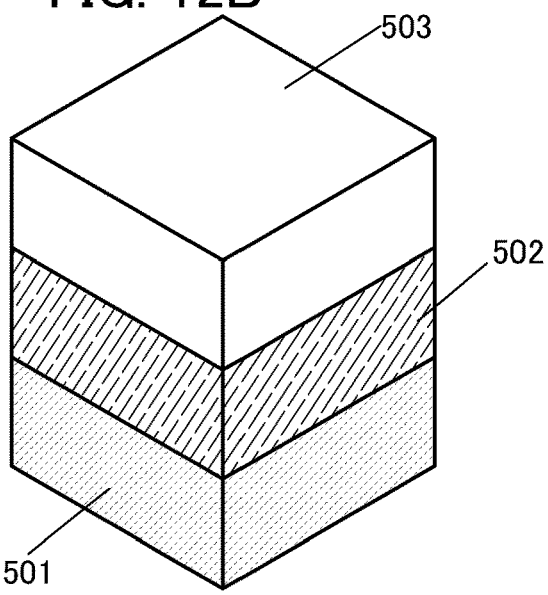

FIG. 12A and FIG. 12B illustrate examples of a structure of a pixel included in the imaging device. The pixel illustrated in FIG. 12A is an example of a stacked structure of a layer 502 and a layer 503.

The layer 502 includes the pixel 100 and the photoelectric conversion device 101. The layer 503 includes an optical conversion layer and a microlens array.

Figure 12C:
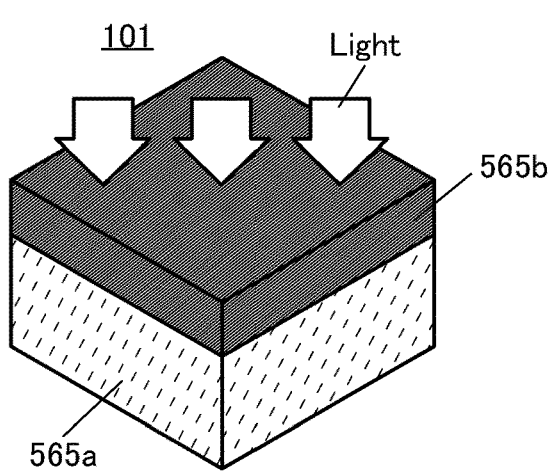

The photoelectric conversion device 101 can have a stacked structure of a layer 565a and a layer 565b as illustrated in FIG. 12C.

The photoelectric conversion device 101 illustrated in FIG. 12C is a pn-junction photodiode; for example, a p-type semiconductor can be used for the layer 565a, and an n-type semiconductor can be used for the layer 565b. Alternatively, an n-type semiconductor may be used for the layer 565a, and a p-type semiconductor may be used for the layer 565b.

Figure 12D:
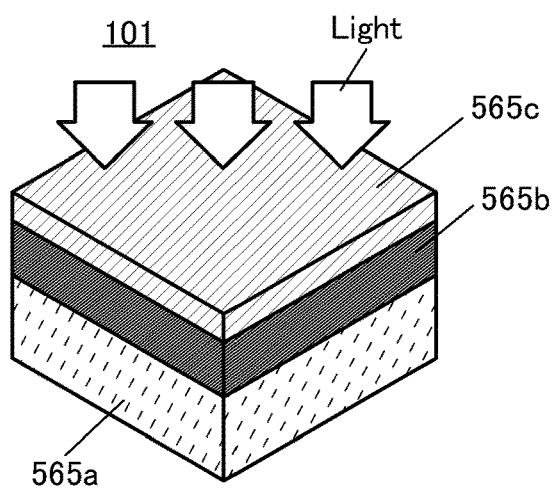

The photoelectric conversion device 101 can have a stacked-layer structure of the layer 565a, the layer 565b, and a layer 565c as illustrated in FIG. 12D.

The photoelectric conversion device 101 illustrated in FIG. 12D is a pn-junction photodiode; for example, a p-type semiconductor can be used for the layer 565a, and an n-type semiconductor can be used for the layer 565b. The stacked structure of the layer 565a and the layer 565b enables formation of a pn-junction photodiode. A p-type semiconductor can be used for the layer 565c. Use of a p-type semiconductor for the layer 565c can inhibit surface scattering, for example, in some cases.

Alternatively, an n-type semiconductor may be used for the layer 565a, a p-type semiconductor may be used for the layer 565b, and an n-type semiconductor may be used for the layer 565c.

Figure 12E:
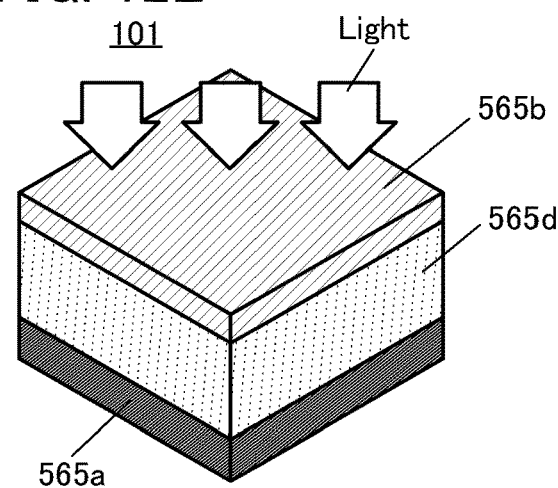

Alternatively, as illustrated in FIG. 12E, the photoelectric conversion device may be a pin-junction photodiode in which a layer 565d that is an i-type semiconductor is provided between the layer 565a and the layer 565b.

The pn-junction photodiode or the pin-junction photodiode can be formed using single crystal silicon. The pin-junction photodiode can also be formed using a thin film of amorphous silicon, microcrystalline silicon, polycrystalline silicon, or the like.

Figure 12F:
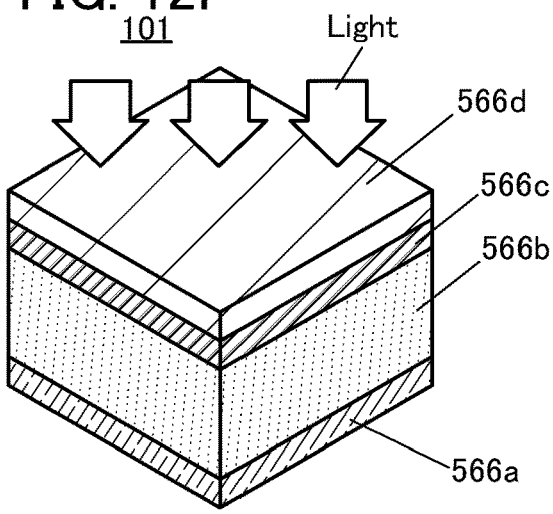

The photoelectric conversion device 101 included in the layer 502 may have a stacked structure of a layer 566a, a layer 566b, a layer 566c, and a layer 566d as illustrated in FIG. 12F. The photoelectric conversion device 101 illustrated in FIG. 12F is an example of an avalanche photodiode, and the layer 566a and the layer 566d correspond to electrodes and the layers 566b and 566c correspond to a photoelectric conversion portion.

The layer 566a is preferably a low-resistance metal layer or the like. For example, aluminum, titanium, tungsten, tantalum, silver, or a stacked layer thereof can be used.

A conductive layer having a high light-transmitting property with respect to visible light is preferably used as the layer 566d. For example, indium oxide, tin oxide, zinc oxide, indium tin oxide, gallium zinc oxide, indium gallium zinc oxide, graphene, or the like can be used. Note that a structure in which the layer 566d is omitted can also be employed.

For the layer 502 illustrated in FIG. 12A, a silicon substrate can be used, for example. The silicon substrate includes a Si transistor or the like. With use of the Si transistor, as well as a pixel circuit, a circuit for driving the pixel circuit, a circuit for reading out an image signal, an image processing circuit, a memory circuit, or the like can be provided. Specifically, some or all of the transistors included in the circuits 201, 301, 302, 303, 304, and 305 described in Embodiment 1 can be provided in the layer 502.

Furthermore, the pixel may have a stacked-layer structure of a layer 501, the layer 502, and the layer 503 as illustrated in FIG. 12B.

The layer 501 can include a capacitor included in the pixel 100.

When the capacitor 104 or the capacitor 150 included in the pixel 100 is provided in the layer 501, the capacitor is stacked over the layer 502. In this case, the area of the imaging device can be made small even if the capacitance value of the capacitor 104 is increased. In the case where the capacitor 104 and the transistor included in the pixel 100 are formed in different processes, the imaging device can be manufactured at lower cost in some cases.

The layer 501 can include, in addition to the capacitor 104, part of semiconductor elements, such as the transistor and the capacitor, included in the pixel 100.

In the case where the layer 501 includes, in addition to the capacitor 104, part of the transistors included in the pixel 100, the ratio of the area of the photoelectric conversion device 101 to the area of the pixel in the layer 502 can be increased. Thus, the sensitivity of the imaging device can be increased in some cases. Furthermore, the resolution of the imaging device can be increased in some cases.

The layer 501 may include some or all of the transistors included in the circuits 201, 301, 302, 303, 304, and 305.

With such a structure, components of the pixel circuit and the peripheral circuits can be distributed in a plurality of layers and the components can be provided to overlap with each other or any of the components and any of the peripheral circuits can be provided to overlap with each other, whereby the area of the imaging device can be reduced. In the structure of FIG. 12B, the layer 501 may serve as a support substrate, and the layer 502 may be provided with the peripheral circuits.

[Stacked Structure 1]

Next, a stacked structure of the imaging device is described with reference to a cross-sectional view.

Figure 13A:
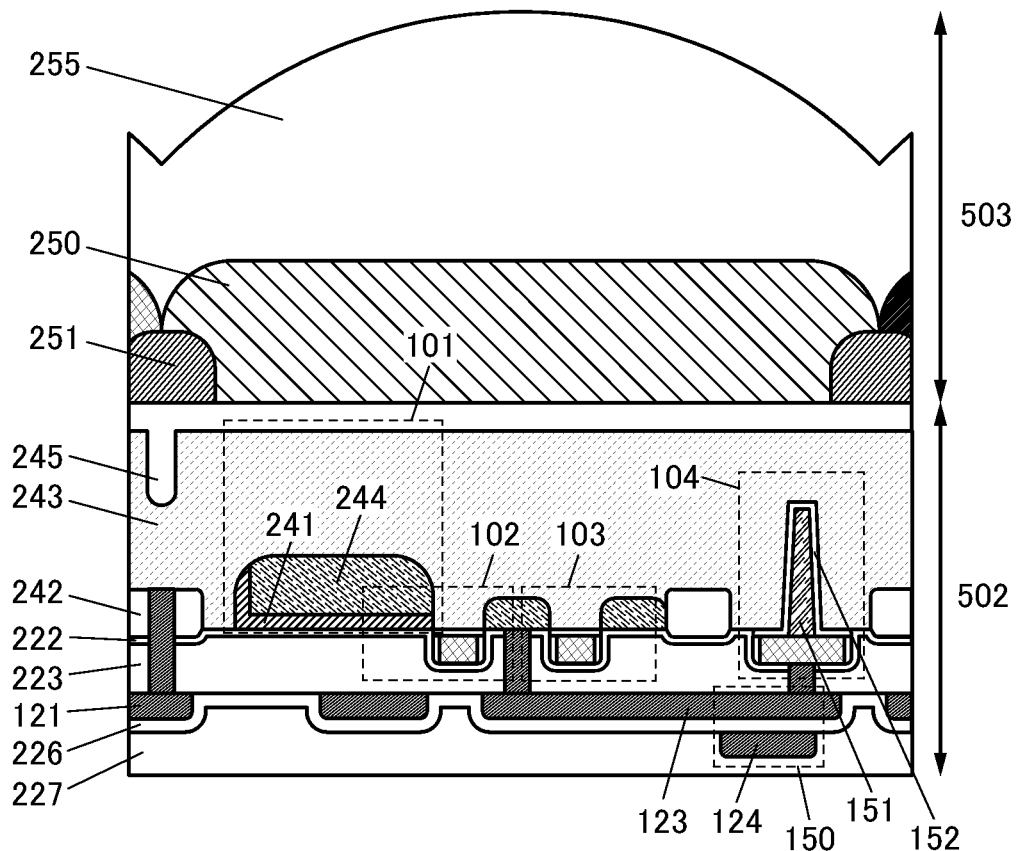
FIG. 13A is a cross-sectional view illustrating a pixel.

FIG. 13A is an example of a cross-sectional view of a stacked body including the layer 502 and the layer 503.

<Layer 502>

The layer 502 includes the pixel 100 formed on a silicon substrate. Here, the transistor 102, the transistor 103, the capacitor 104, the capacitor 150, and the photoelectric conversion device 101 are illustrated as parts of the pixel 100.

The photoelectric conversion device 101 is a pn-junction photodiode formed on a silicon substrate and includes a p-type region 243 and an n-type region 244. The photoelectric conversion device 101 is a pinned photodiode, which can suppress dark current and reduce noise with a p-type region 241 provided on the surface side of the n-type region 244. Note that the p-type region 243 may be used as the p-type region 241. The p-type region 241 preferably has lower resistance than the p-type region 243. Furthermore, the n-type region 244 preferably has lower resistance than the p-type region 243. In addition, p-type regions and n-type regions may be interchanged between the p-type region 243, the p-type region 241, and the n-type region 244.

The transistor 102 and the transistor 103 are transistors formed on the silicon substrate. The transistor 102 and the transistor 103 each include the following: a conductive layer serving as a gate; a source, a drain, and a channel formation region positioned between the source and the drain, which are formed using the silicon substrate; and a gate insulating layer provided between the conductive layer serving as a gate and the channel formation region. Note that in the example illustrated in FIG. 13A, a source region and a drain region of each of the transistor 102 and the transistor 103 are formed using the n-type region.

In the layer 502, an insulating layer 242 and an insulating layer 245 are provided. The insulating layer 242 functions as an element isolation layer. The insulating layer 245 has a function of suppressing carrier leakage.

The silicon substrate is provided with a groove that separates pixels, and the insulating layer 245 is provided on the top surface of the silicon substrate and in the groove. The insulating layer 245 can suppress leakage of carriers generated in the photoelectric conversion device 101 to an adjacent pixel. The insulating layer 245 also has a function of suppressing entry of stray light. For example, the grove provided in the insulating layer 245 inhibits entry of stray light from the adjacent pixel in some cases. Therefore, color mixture can be suppressed with the insulating layer 245. Note that an anti-reflection film may be provided between the top surface of the silicon substrate and the insulating layer 245.

The element isolation layer can be formed by a LOCOS (LOCal Oxidation of Silicon) method, an STI (Shallow Trench Isolation) method, or the like. As the insulating layer 245, for example, an inorganic insulating film of silicon oxide, silicon nitride, or the like or an organic insulating film of polyimide, acrylic, or the like can be used. The insulating layer 245 may have a multilayer structure.

In the example illustrated in FIG. 13A, the n-type region 244 (corresponding to a cathode) of the photoelectric conversion device 101 can also function as one of the source and the drain of the transistor 102.

Furthermore, in the layer 502, insulating layers 222, 223, 226, and 227 and a wiring 121 are provided. The insulating layer 222 functions as a protective film. The insulating layers 223 and 227 function as an interlayer insulating film and a planarization film. The insulating layer 226 functions as a dielectric layer of the capacitor 150. The wiring 121 has a function of a power supply line. The p-type region 243 (anode) is electrically connected to the wiring 121.

As the protective film, for example, a silicon nitride film, a silicon oxide film, an aluminum oxide film, or the like can be used. As the interlayer insulating film and the planarization film, for example, an inorganic insulating film such as a silicon oxide film or an organic insulating film of an acrylic resin, a polyimide resin, or the like can be used. As the dielectric layer of the capacitor, a silicon nitride film, a silicon oxide film, an aluminum oxide film, or the like can be used.

Figure 18A:
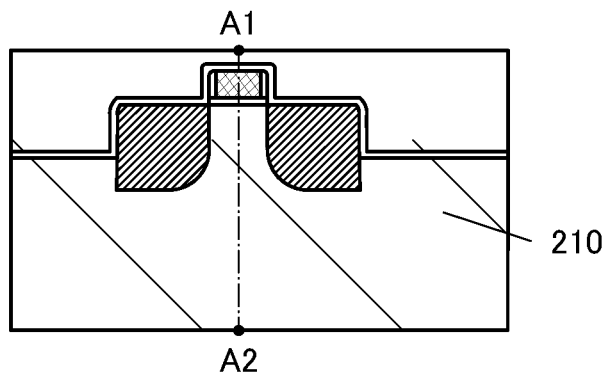
FIGS. 18A to 18C are diagrams illustrating Si transistors.
Figure 18B:
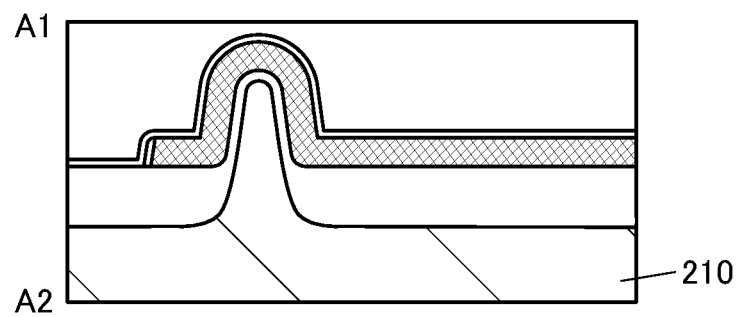

The Si transistor illustrated in FIG. 13A is a planar transistor including a channel formation region in the silicon substrate. Note that the Si transistor may have a fin-type structure as illustrated in FIG. 18A. FIG. 18B illustrates a cross section along A1-A2 (cross section in the channel width direction) in FIG. 18A.

Figure 18C:
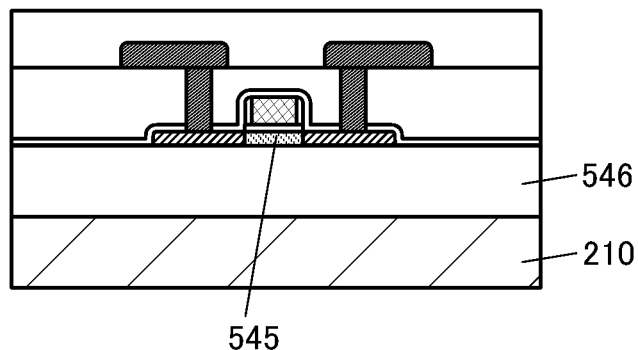

Alternatively, as illustrated in FIG. 18C, a transistor including a semiconductor layer 545 of a silicon thin film may be used. The semiconductor layer 545 can be single crystal silicon (SOI (Silicon on Insulator)) formed on an insulating layer 546 on a silicon substrate 210, for example.

As a conductor that can be used for a wiring, an electrode, and a plug used for electrical connection between devices, a metal element selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, and lanthanum; an alloy containing any of the above metal elements as its component; an alloy containing a combination of the above metal elements; or the like is selected and used as appropriate. The conductor is not limited to a single layer, and may be a plurality of layers including different materials.

The capacitor 104 is a trench capacitor provided on the silicon substrate. The capacitor 104 illustrated in FIG. 13A includes a trench formed in the p-type region 243 of the silicon substrate, a conductive layer 151 formed so that the trench is filled therewith, and an insulating layer 152 formed between the p-type region 243 and the conductive layer 151. The p-type region 243 and the conductive layer 151 function as electrodes of the capacitor 104.

The aspect ratio of the trench formed on the silicon substrate is preferably greater than or equal to 10, further preferably greater than or equal to 20. The higher the aspect ratio is, the higher the capacitance value with respect to the circuit area is. The aspect ratio of the trench is a value obtained by dividing the depth of the trench with a diameter of an upper portion of the trench.

The film thicknesses of the insulating layer 152 is preferably smaller than or equal to 20 nm, further preferably smaller than or equal to 15 nm, still further preferably smaller than or equal to 10 nm. The thickness of the insulating layer 152 is decreased, whereby the capacitance value of the capacitor 104 can be increased. On the other hand, the insulating layer 152 with a certain thickness makes variation between elements small. Thus, the thickness of the insulating layer 152 is greater than or equal to 1 nm, or greater than or equal to 2 nm, for example.

The conductive layer 151 can be formed using, for example, the above-described materials and structures that can be used for wirings, electrodes, and plugs, and the like. Alternatively, polycrystalline silicon doped with impurities such as phosphorus or boron for reducing resistance can be used for the conductive layer 151.

The insulating layer 152 can function as a dielectric of the capacitor 104. For the insulating layer 152, a thermal oxide film obtained by oxidizing the surface of the trench that is formed on the silicon substrate is preferably used, for example.

In one or both of the capacitor 104 and the capacitor 150, the dielectric preferably includes one or more selected from silicon oxide, aluminum oxide, hafnium oxide, and zirconium oxide. Alternatively, a stack of these materials may be used.

In one or both of the capacitor 104 and the capacitor 150, the dielectric may include an oxide including one or more selected from silicon, aluminum, titanium, lead, barium, strontium, barium, zirconium, and bismuth. For example, strontium titanate, barium titanate, barium strontium titanate, or the like may be included. Alternatively, stacked structures including these materials may be used.

Figure 13B:
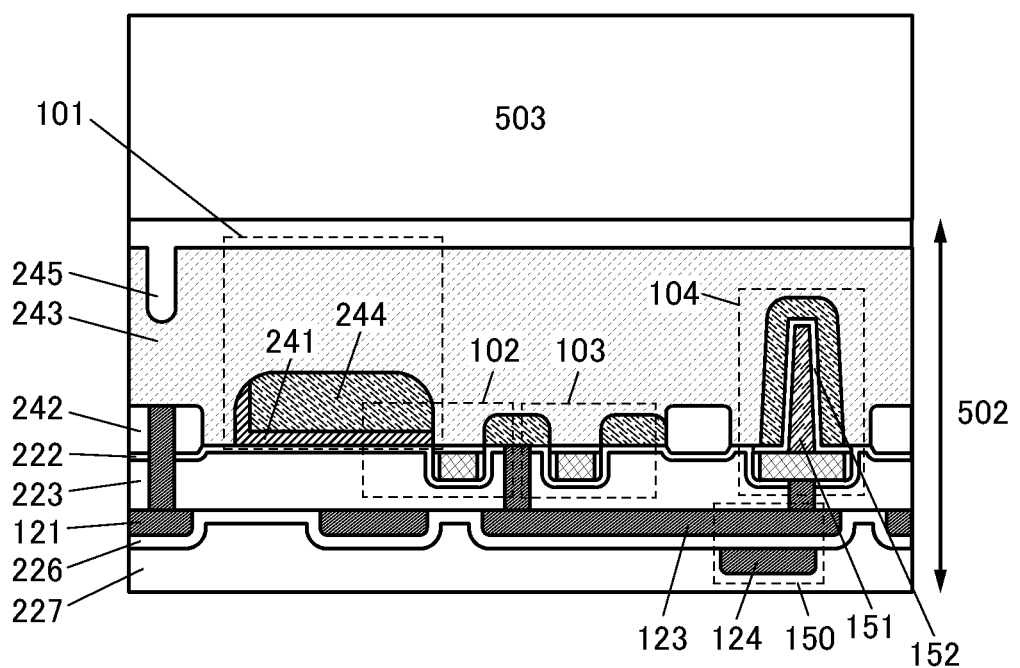
FIG. 13B is a cross-sectional view illustrating a pixel.

FIG. 13B illustrates an example in which the structure of the capacitor 104 is different from that in FIG. 13A. Note that the details of the layer 503 in FIG. 13B are not shown for simplicity. In the capacitor 104 illustrated in FIG. 13B, an example in which an n-type region is provided on a surface of the trench provided on the silicon substrate is shown. In the capacitor 104 illustrated in FIG. 13B, the n-type region provided on a surface of the trench and the conductive layer 151 function as electrodes of the capacitor 104. The n-type region provided on the surface of the trench preferably has lower resistance than the p-type region 243.

The capacitor 150 includes a conductive layer 123 and a conductive layer 124 with the insulating layer 226 therebetween. The conductive layer 123 and the conductive layer 124 function as electrodes of the capacitor 150.

The conductive layer 123 is electrically connected to the other of the source and the drain of the transistor 102 and one of the source and the drain of the transistor 103 through a conductive layer formed in the insulating layer 223.

Note that in FIG. 13A, FIG. 13B, and FIG. 14 that is describe later, the capacitor 104 and the capacitor 150 may be interchanged.

<Layer 503>

The layer 503 is formed over the layer 502. The layer 503 includes a light-blocking layer 251, an optical conversion layer 250, and a microlens array 255.

The light-blocking layer 251 can suppress entry of light into an adjacent pixel. As the light-blocking layer 251, a metal layer of aluminum, tungsten, or the like can be used. The metal layer and a dielectric film functioning as an anti-reflection film may be stacked.

As the optical conversion layer 250, a color filter can be used. When colors of R (red), G (green), B (blue), Y (yellow), C (cyan), M (magenta), and the like are assigned to the color filters of respective pixels, a color image can be obtained.

When a wavelength cut filter is used as the optical conversion layer 250, the imaging device can capture images in various wavelength regions For example, when a filter that blocks light having a wavelength shorter than or equal to that of visible light is used as the optical conversion layer 250, an infrared imaging device can be obtained. When a filter that blocks light having a wavelength shorter than or equal to that of near infrared light is used as the optical conversion layer 250, a far-infrared imaging device can be obtained. When a filter that blocks light having a wavelength longer than or equal to that of visible light is used as the optical conversion layer 250, an ultraviolet imaging device can be obtained.

Furthermore, when a scintillator is used as the optical conversion layer 250, an imaging device that obtains an image visualizing the intensity of radiation, which is used for an X-ray imaging device or the like, can be obtained. Radiation such as X-rays passes through an object and enters the scintillator, and then is converted into light (fluorescence) such as visible light or ultraviolet light owing to a photoluminescence phenomenon. Then, the photoelectric conversion device 101 detects the light to obtain image data. Furthermore, the imaging device having this structure may be used in a radiation detector or the like.

A scintillator contains a substance that, when irradiated with radiation such as X-rays or gamma-rays, absorbs energy of the radiation to emit visible light or ultraviolet light. For example, a resin or ceramics in which $Gd_2O_2S$:Tb, $Gd_2O_2S$:Pr, $Gd_2O_2S$:Eu, BaFCl:Eu, NaI, CsI, $CaF_2$, $BaF_2$, $CeF_3$, LiF, LiI, ZnO, or the like is dispersed can be used.

The microlens array 255 is provided over the optical conversion layer 250. Light passing through an individual lens of the microlens array 255 goes through the optical conversion layer 250 directly under the lens, and the photoelectric conversion device 101 is irradiated with the light. With the microlens array 255, collected light can be incident on the photoelectric conversion device 101; thus, photoelectric conversion can be efficiently performed. The microlens array 255 is preferably formed using a resin, glass, or the like with a high visible-light transmitting property.

[Stacked Structure 2]

Figure 14:
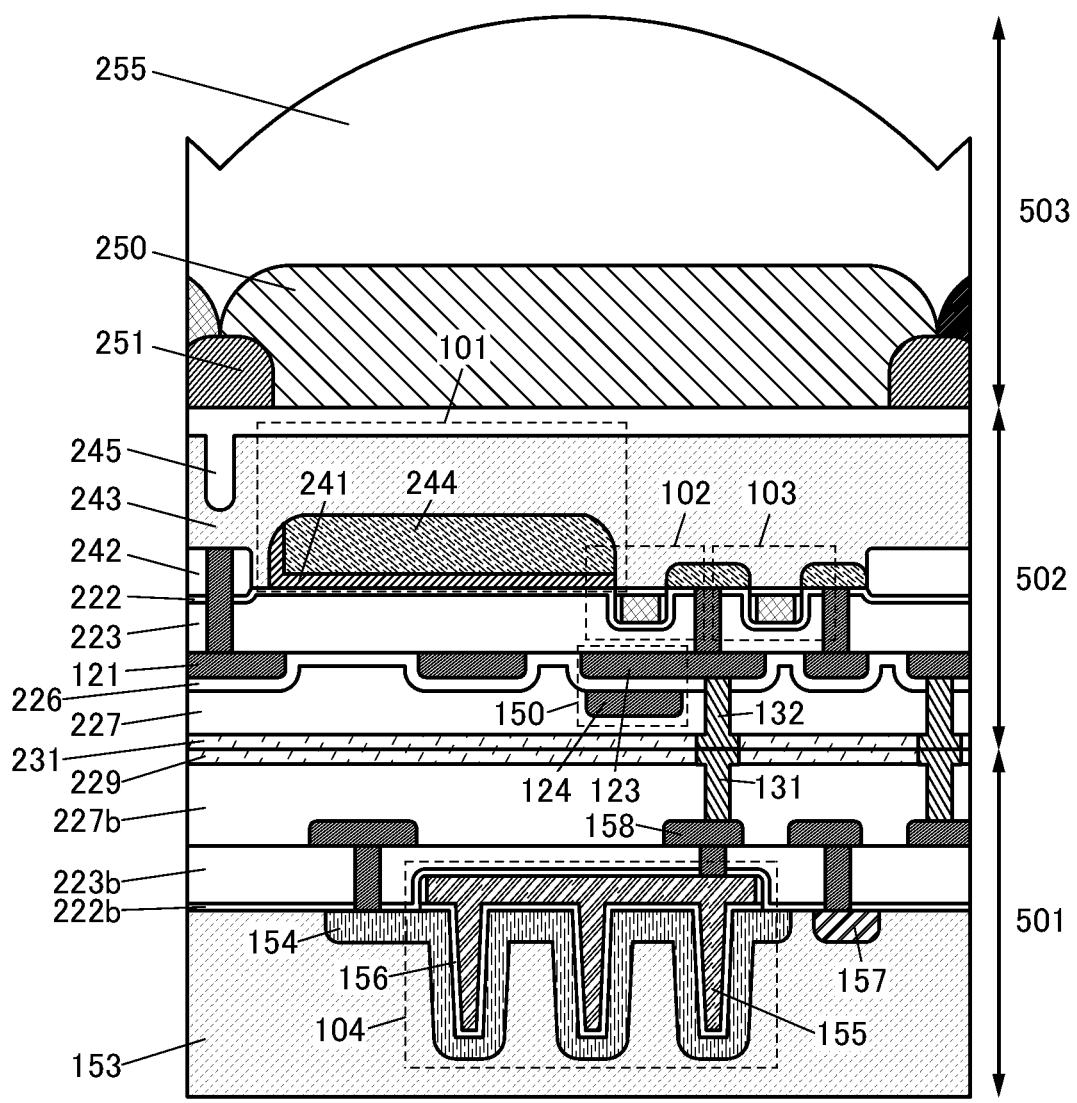
FIG. 14 is a cross-sectional view illustrating a pixel.

FIG. 14 illustrates a structure example different from that in FIG. 13B.

FIG. 14 is an example of a cross-sectional view of a stacked body that includes the layer 501 to the layer 503 and has a bonding plane between the layer 501 and the layer 502.

FIG. 14 is different from FIG. 13B in that an insulating layer 231 and a conductive layer 132 are included, that the layer 501 is included, and the capacitor 104 is provided in a different layer from that in FIG. 13B. Whereas FIG. 13 illustrates the example in which the capacitor 104 is provided in the layer 502, FIG. 14 illustrates an example in which the capacitor 104 is provided in the layer 501.

The layer 502 illustrated in FIG. 14 includes the insulating layer 231 and the conductive layer 132.

The insulating layer 231 and the conductive layer 132 function as bonding layers.

The conductive layer 132 is electrically connected to the conductive layer 123.

<Layer 501>

The layer 501 illustrated in FIG. 14 includes a silicon substrate 153 and the capacitor 104. The capacitor 104 is a trench capacitor provided in the silicon substrate. The capacitor 104 illustrated in FIG. 14 includes an n-type region 154 formed near the surface of the trench formed in the silicon substrate 153, a conductive layer 155 formed so that the trench is filled therewith, and an insulating layer 156 formed between the n-type region and the conductive layer 155. The n-type region 154 and the conductive layer 155 function as electrodes of the capacitor 104. The insulating layer 156 functions as a dielectric layer of the capacitor 104. Note that the capacitor 104 illustrated in FIG. 14 may have a structure without the n-type region 154. For materials, structures, and the like, which can be employed for the conductive layer 155 and the insulating layer 156, the description for the conductive layer 151 and the insulating layer 152 can be referred to.

The insulating layer 156 can be formed by thermal oxidation of silicon, for example. Formation of an insulating film obtained by thermal oxidation of silicon enables a dense thin film with a uniform thickness to be formed. Thermal oxidation of silicon is a way for enabling formation of a thinner insulating film simply and stably, and such an insulating film is suitable for formation of the capacitor 104 with high capacitance value.

The layer 501 includes an insulating layer 222b, an insulating layer 223b, an insulating layer 227b, an insulating layer 229, a conductive layer 158, and a conductive layer 131, over the silicon substrate 153 and the conductive layer 155. The insulating layers 222b, 223b, and 227b function as interlayer insulating films and planarization films.

The insulating layer 229 and the conductive layer 131 function as bonding layers. The conductive layer 131 is electrically connected to the conductive layer 155 through the conductive layer 158 formed in the insulating layer 227b and a conductive layer formed in the insulating layer 223b.

[Stacked Structure 3]

Figure 15:
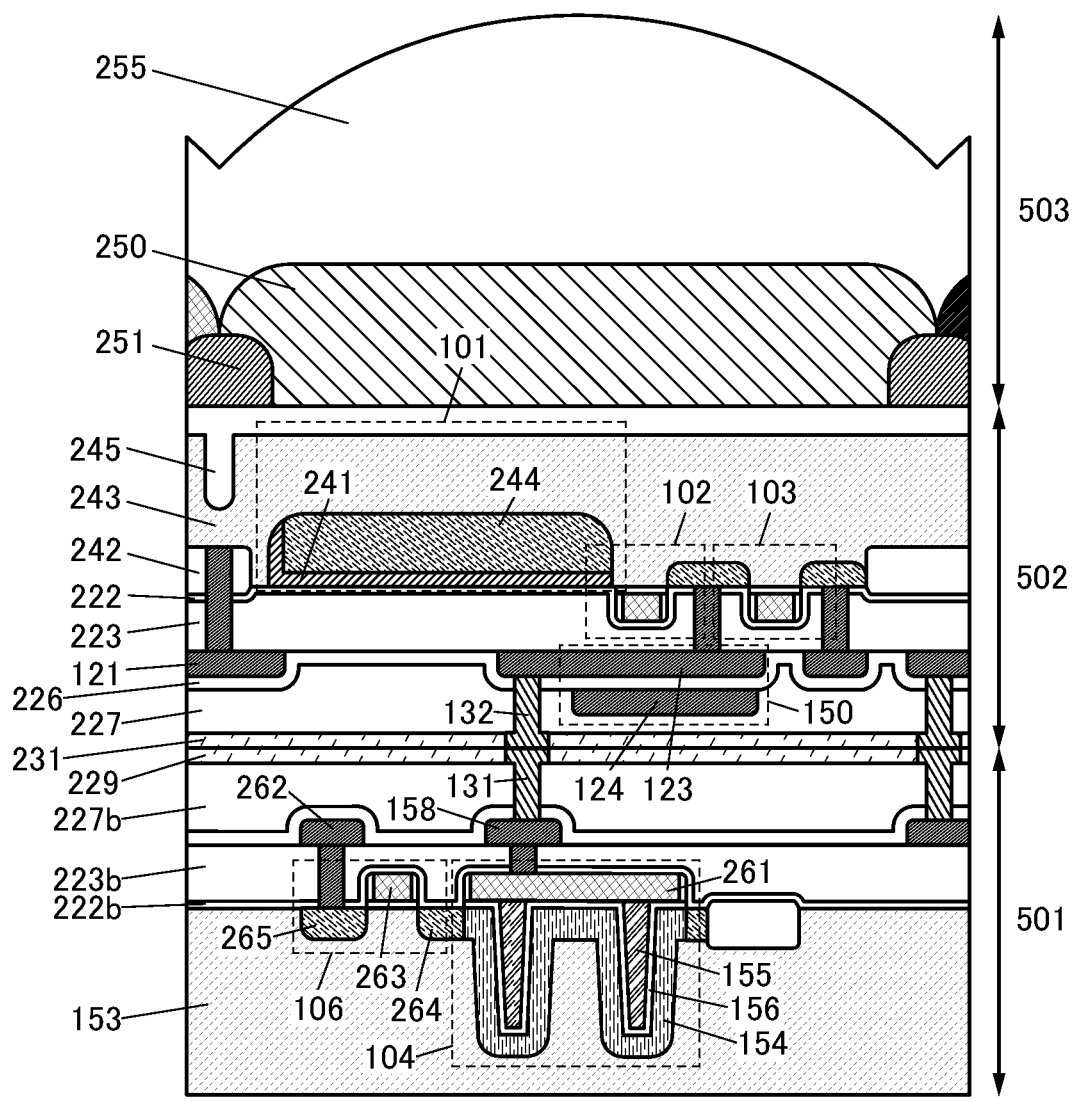
FIG. 15 is a cross-sectional view illustrating a pixel.

FIG. 15 illustrates an example in which the layer 501 includes a transistor.

The stacked structure illustrated in FIG. 15 includes the layer 501 to the layer 503 and a bonding plane between the layer 501 and the layer 502.

Figure 16A:
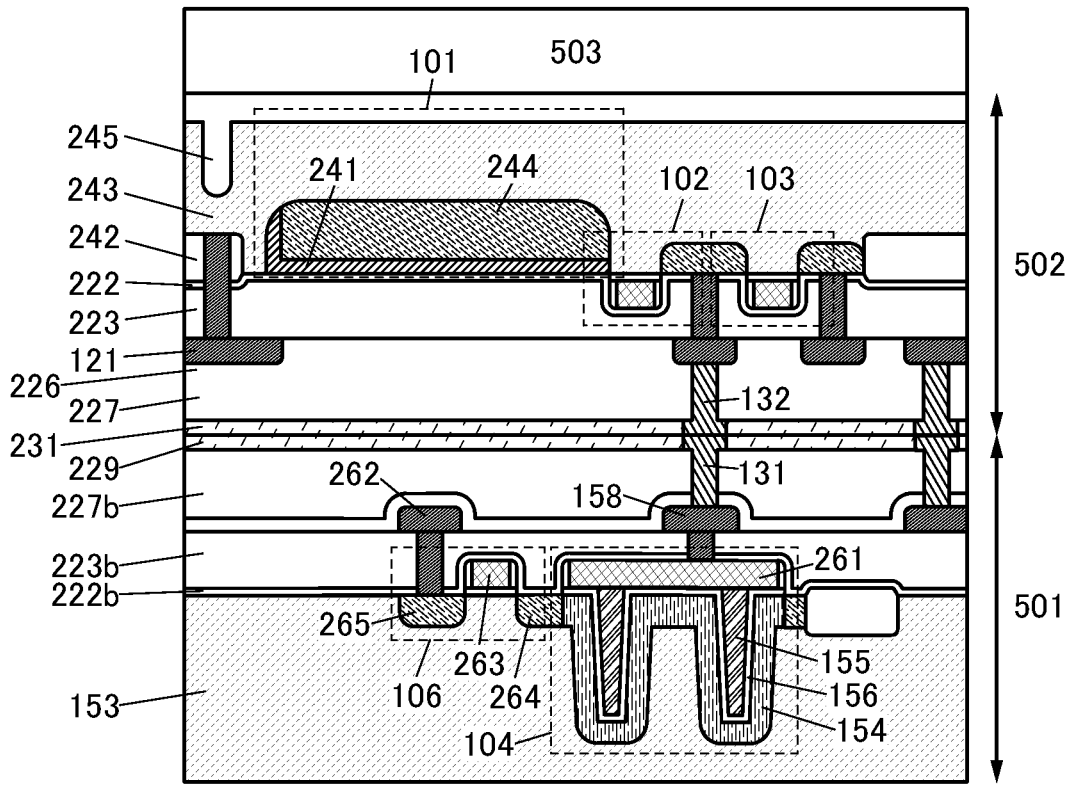
FIG. 16A is a cross-sectional view illustrating a pixel.

In FIG. 15, the layer 501 includes the capacitor 104 and the transistor 106, the layer 502 includes the transistor 102, the transistor 103, the photoelectric conversion device 101, and the capacitor 150, and the layer 503 includes the optical conversion layer 250. Furthermore, in the pixel included in the imaging device of one embodiment of the present invention, the layer 502 may have a structure without the capacitor 150. FIG. 16A illustrates an example in which the capacitor 150 is omitted from the structure of FIG. 15.

The transistor 106 in FIG. 15 includes a conductive layer 263 which can function as a gate, and an n-type region 264 and an n-type region 265 which function as a source region and a drain region.

The capacitor 104 in FIG. 15 includes a conductive layer 261 over the conductive layer 155 additionally as compared with the capacitor 104 illustrated in FIG. 14. The conductive layer 155 and the conductive layer 261 are electrically connected to each other. The conductive layer 261 and the conductive layer 263 may be formed through the same process.

Current flows between the n-type region 154 and the n-type region 264.

The n-type region 265 is electrically connected to a conductive layer 262 over the insulating layer 223b through a conductive layer formed to be embedded in the insulating layer 222b and the insulating layer 223b. The conductive layer 262 functions as the wiring 111, for example. Alternatively, for example, the conductive layer 262 is electrically connected to the wiring 111.

A p-type region may be used for a channel formation region of the transistor 106, or the like, for example. The n-type regions 264, 265, and 154 preferably have lower resistance than the p-type region. Furthermore, the p-type region used for the channel formation region of the transistor 106 or the like may be interchanged with an n-type region, and the n-type regions 264, 265, and 154 may be interchanged with p-type regions.

With use of the structures of FIG. 15 and FIG. 16A, the number of transistors placed in the layer 502 can be smaller and the ratio of the area of the photoelectric conversion device 101 to the area of the pixel can be higher, than those in the structure illustrated in FIG. 14. Consequently, the sensitivity of the imaging device of one embodiment of the present invention can be increased. Furthermore, the resolution of the imaging device of one embodiment of the present invention can be increased.

In the structures of FIG. 15 and FIG. 16A, the n-type region 264 and the n-type region 154 are in contact with each other and can be formed to be a continuous structure. Thus, the distance between the elements, i.e., between the transistor 106 and the capacitor 104 can be reduced, whereby the circuit can have high integration degree.

Figure 16B:
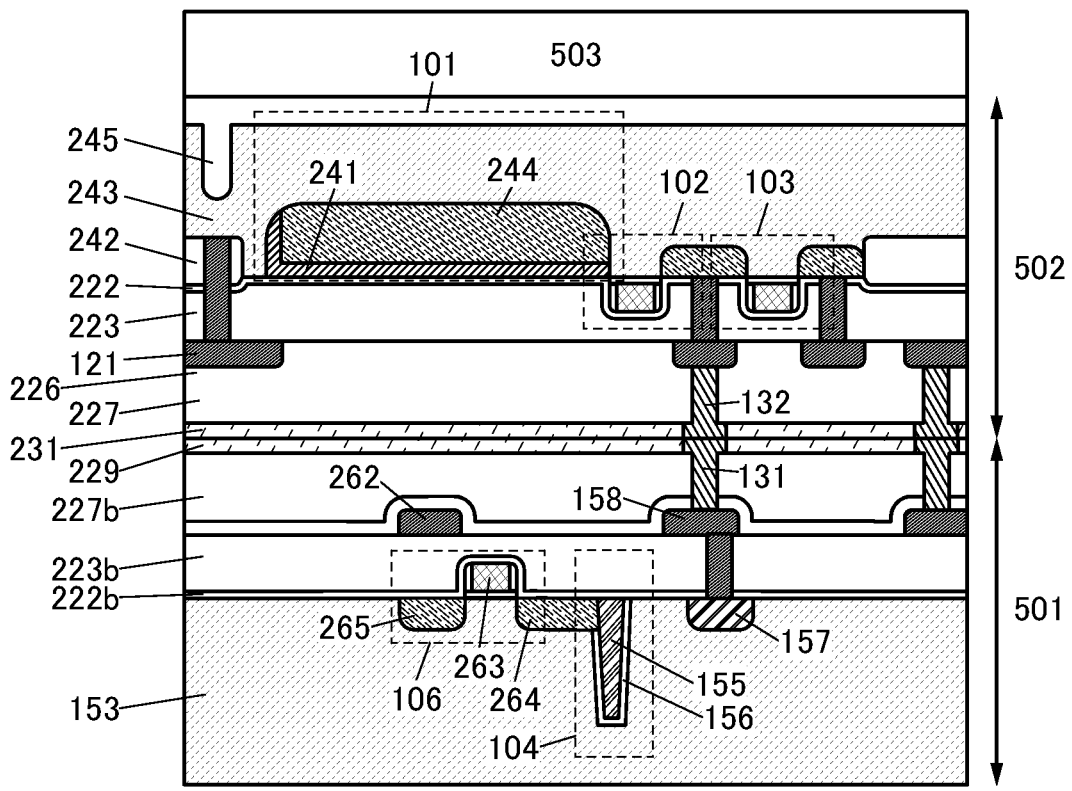
FIG. 16B is a cross-sectional view illustrating a pixel.

As the structure of the capacitor 104, a structure illustrated in FIG. 16B may be employed. In the capacitor 104 illustrated in FIG. 16B, the conductive layer 155 included in the capacitor 104 is in contact with the n-type region 264 included in the transistor 106 in a shallow region of the trench. The n-type region 154 is not necessarily provided in the capacitor 104 illustrated in FIG. 16B. In FIG. 16B, the conductive layer 158 is preferably electrically connected to a substrate potential of the silicon substrate 153.

Figure 17A:
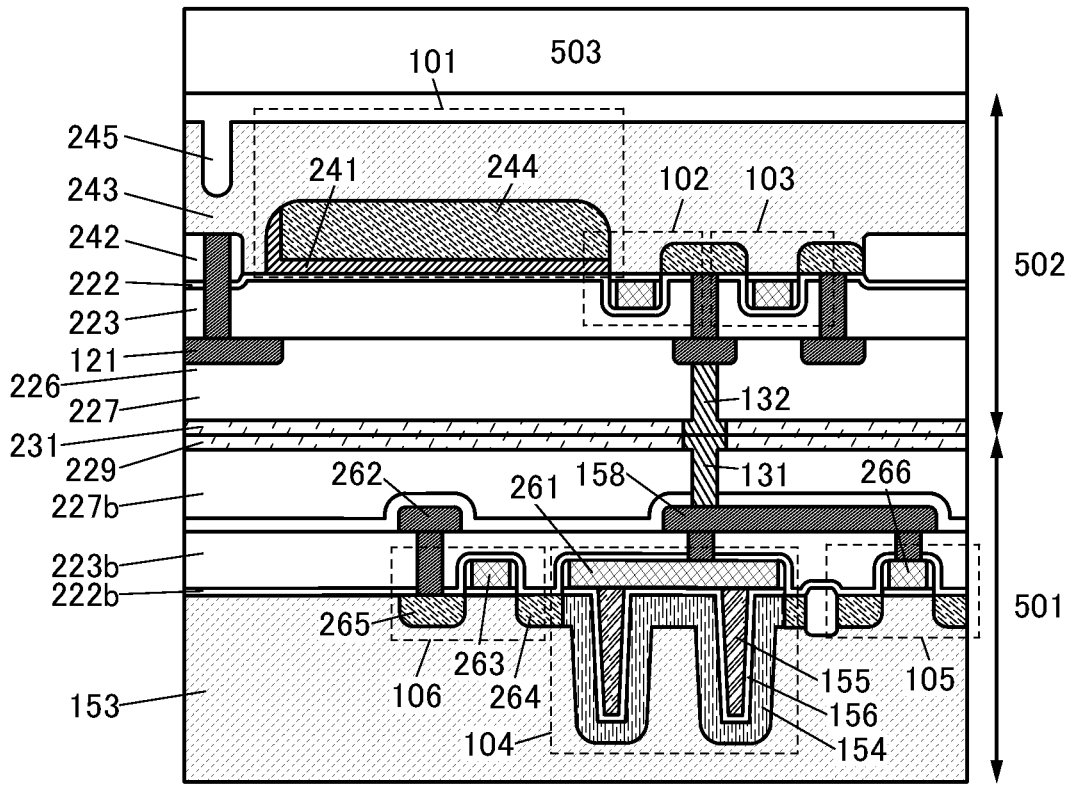
FIG. 17A is a cross-sectional view illustrating a pixel.

FIG. 17A illustrates an example in which the layer 501 includes the transistor 105 in addition to the structure elements illustrated in FIG. 16A. In FIG. 17A, the transistor 105 is formed on the silicon substrate 153. A conductive layer 266 included in the transistor 105 can function as a gate of the transistor 105. The conductive layer 266 is electrically connected to the conductive layer 261 through the conductive layer 158.

Figure 17B:
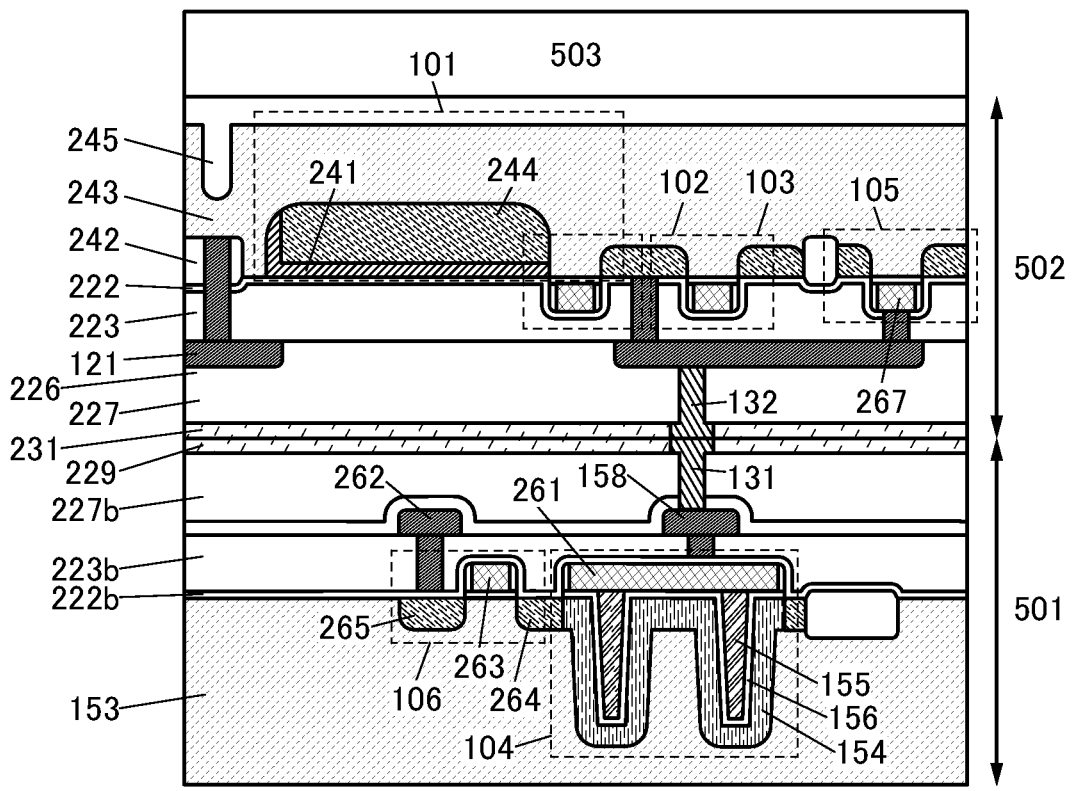
FIG. 17B is a cross-sectional view illustrating a pixel.

FIG. 17B illustrates an example in which the layer 502 includes the transistor 105 in addition to the structure elements illustrated in FIG. 16A. The transistor 105 is formed on the silicon substrate. A conductive layer 267 included in the transistor 105 can function as a gate of the transistor 105. The conductive layer 267 is electrically connected to the other of the source and the drain of the transistor 102 and one of the source and the drain of the transistor 103 through a conductive layer formed in the insulating layer 223 or the like.

Note that the detailed description of the layer 503 is omitted in FIG. 16A, FIG. 16B, FIG. 17A, and FIG. 17B for simplicity.

Any of the structures illustrated in FIG. 13A, FIG. 13B, FIG. 14, FIG. 15, FIG. 16A, FIG. 16B, FIG. 17A, and FIG. 17B may be applied to transistors and the capacitor included in the pixel illustrated in FIG. 11C. For example, any of the structures of the capacitor 104 may be applied to the capacitor 171. Furthermore, any of the structures of the transistor 106 may be employed for the transistor 172.

[Bonding]

Next, bonding of the layer 501 and the layer 502 is described with reference to FIG. 14 or the like.

The insulating layer 229 and the conductive layer 131 are provided in the layer 501. The conductive layer 131 includes a region embedded in the insulating layer 229. Furthermore, the surfaces of the insulating layer 229 and the conductive layer 131 are planarized to be level with each other.

The insulating layer 231 and the conductive layer 132 are provided in the layer 502. The conductive layer 132 includes a region embedded in the insulating layer 231. Furthermore, the surfaces of the insulating layer 231 and the conductive layer 132 are planarized to be level with each other.

Here, a main component of the conductive layer 131 and a main component of the conductive layer 132 are preferably the same metal element. Furthermore, the insulating layer 229 and the insulating layer 231 are preferably formed of the same component.

For the conductive layers 131 and 132, Cu, Al, Sn, Zn, W, Ag, Pt, or Au can be used, for example. Preferably, Cu, Al, W, or Au is used for easy bonding. In addition, for the insulating layers 229 and 231, silicon oxide, silicon oxynitride, silicon nitride oxide, silicon nitride, titanium nitride, or the like can be used.

That is, the same metal material described above is preferably used for the conductive layer 131 and the conductive layer 132. Furthermore, the same insulating material described above is preferably used for the insulating layer 229 and the insulating layer 231. With this structure, bonding at a boundary between the layer 501 and the layer 502 can be performed with high yield.

Note that the conductive layer 131 and the conductive layer 132 may each have a multilayer structure of a plurality of layers; in that case, the outer layers (bonding surfaces) are formed of the same metal material. The insulating layer 229 and the insulating layer 231 may each have a multilayer structure of a plurality of layers; in that case, the outer layers (bonding surfaces) are formed of the same insulating material.

Through the above bonding, the electrical connection between the conductive layer 131 and the conductive layer 132 can be obtained favorably. Moreover, the connection between the insulating layer 229 and the insulating layer 231 with sufficient mechanical strength can be obtained.

For bonding metal layers to each other, a surface activated bonding method in which the cleaned and activated surfaces obtained by removing an oxide film, a layer adsorbing impurities, and the like on the surface by sputtering or the like are brought into contact to be bonded to each other can be used. Alternatively, a diffusion bonding method in which the surfaces are bonded to each other by using temperature and pressure together can be used, for example. Both methods cause bonding at an atomic level, and therefore not only electrically but also mechanically excellent bonding can be obtained.

Furthermore, for bonding insulating layers to each other, a hydrophilic bonding method or the like can be used; in the method, after high planarity of the insulating layers is obtained by polishing or the like, the surfaces of the insulating layers are subjected to hydrophilicity treatment with oxygen plasma or the like, arranged in contact with and bonded to each other temporarily, and then dehydrated by heat treatment, so that final bonding is performed. The hydrophilic bonding method can also cause bonding at an atomic level; thus, mechanically excellent bonding can be obtained.

When the layer 501 and the layer 502 are bonded to each other, the insulating layers and the metal layers coexist on their bonding surfaces; therefore, the surface activated bonding method and the hydrophilic bonding method are performed in combination, for example.

For example, a method can be used in which the surfaces are made clean after polishing, the surfaces of the metal layers are subjected to antioxidant treatment and hydrophilicity treatment, and then bonding is performed. Furthermore, hydrophilicity treatment may be performed on the surfaces of the metal layers being hardly oxidizable metal such as Au. Note that a bonding method other than the above-mentioned methods may be used.

With the above bonding, the transistor 102, the transistor 103, the capacitor 150, and the like included in the layer 502 can be electrically connected to the capacitor 104 included in the layer 501.

This embodiment can be combined with any of the other embodiments and examples as appropriate.

Embodiment 3

In this embodiment, examples of a package and a camera module in each of which an image sensor chip is placed are described. For the image sensor chip, the structure of the imaging device of one embodiment of the present invention can be used.

Figure 19A:
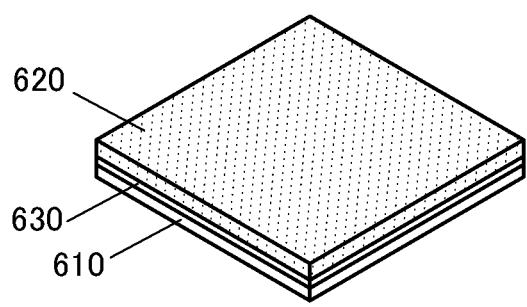
FIGS. 19A to 19F are perspective views illustrating a package and a module including an imaging device.

FIG. 19A is an external perspective view of the top surface side of a package in which an image sensor chip is placed. The package includes a package substrate 610 to which an image sensor chip 650 is fixed, a cover glass 620, an adhesive 630 for bonding them, and the like.

Figure 19D:
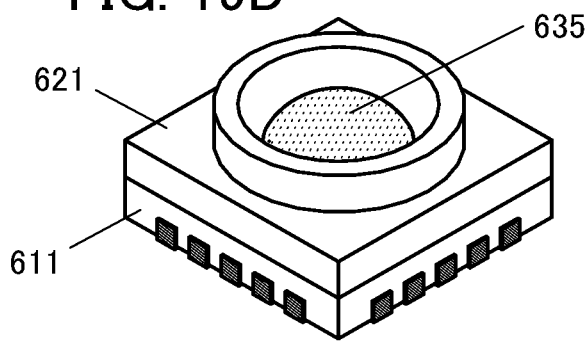
Figure 19B:
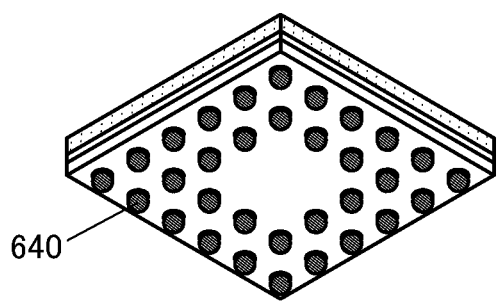

FIG. 19B is an external perspective view of the bottom surface side of the package. A BGA (Ball grid array) in which solder balls are used as bumps 640 on the bottom surface of the package is employed. Note that, without being limited to the BGA, an LGA (Land grid array), a PGA (Pin Grid Array), or the like may be employed.

Figure 19E:
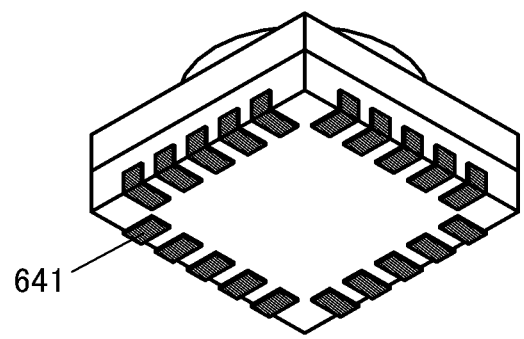
Figure 19C:
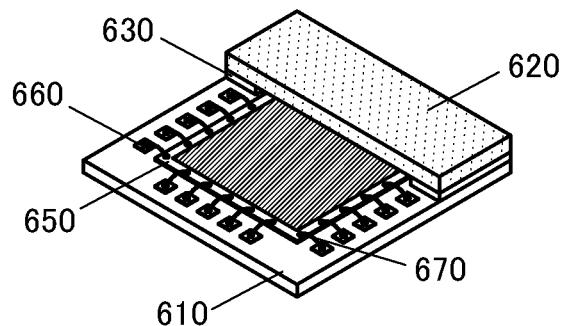

FIG. 19C is a perspective view of the package, in which parts of the cover glass 620 and the adhesive 630 are not illustrated. Electrode pads 660 are formed over the package substrate 610, and the electrode pads 660 and the bumps 640 are electrically connected to each other via through-holes. The electrode pads 660 are electrically connected to the image sensor chip 650 through wires 670.

FIG. 19D is an external perspective view of the top surface side of a camera module in which an image sensor chip is placed in a package with a built-in lens. The camera module includes a package substrate 611 to which an image sensor chip 651 is fixed, a lens cover 621, a lens 635, and the like. Furthermore, an IC chip 690 having functions of a driver circuit, a signal conversion circuit, and the like of the imaging device is provided between the package substrate 611 and the image sensor chip 651; thus, the structure as an SiP (System in package) is included.

FIG. 19E is an external perspective view of the bottom surface side of the camera module. A QFN (Quad flat no-lead package) structure in which lands 641 for mounting are provided on the bottom surface and side surfaces of the package substrate 611 is employed. Note that this structure is only an example, and a QFP (Quad flat package) or the above-mentioned BGA may also be provided.

Figure 19F:
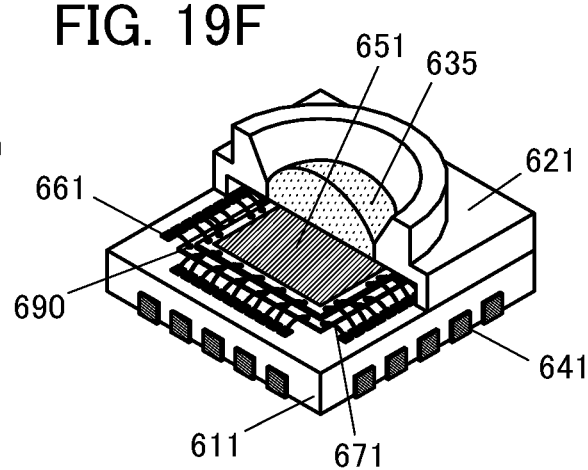

FIG. 19F is a perspective view of the module, in which parts of the lens cover 621 and the lens 635 are not illustrated. The lands 641 are electrically connected to electrode pads 661, and the electrode pads 661 are electrically connected to the image sensor chip 651 or the IC chip 690 through wires 671.

The image sensor chip placed in a package having the above form can be easily mounted on a printed substrate or the like, and the image sensor chip can be incorporated into a variety of semiconductor devices and electronic devices.

This embodiment can be combined with any of the other embodiments and examples as appropriate.

Embodiment 4

As electronic devices that can include the imaging device of one embodiment of the present invention, display devices, personal computers, image memory devices or image reproducing devices provided with storage media, mobile phones, game machines including portable game machines, portable data terminals, e-book readers, cameras such as video cameras and digital still cameras, goggle-type displays (head mounted displays), navigation systems, audio reproducing devices (car audio players, digital audio players, and the like), copiers, facsimiles, printers, multifunction printers, automated teller machines (ATM), vending machines, and the like are given. Specific examples of these electronic devices are illustrated in FIG. 20A to FIG. 20F.

Figure 20A:
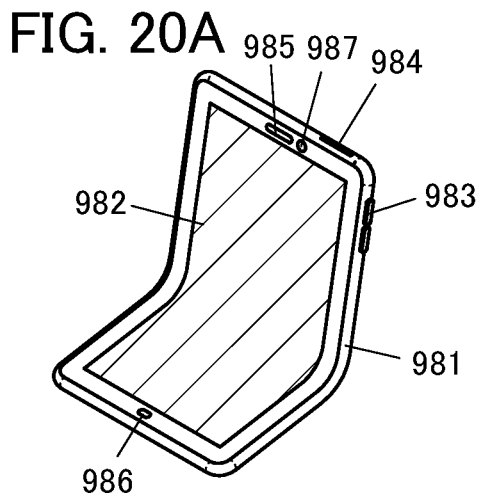
FIGS. 20A to 20F are diagrams illustrating electronic devices.

FIG. 20A is an example of a mobile phone, which includes a housing 981, a display portion 982, an operation button 983, an external connection port 984, a speaker 985, a microphone 986, a camera 987, and the like. The display portion 982 of the mobile phone includes a touch sensor. A variety of operations such as making a call and inputting text can be performed by touch on the display portion 982 with a finger, a stylus, or the like. The imaging device of one embodiment of the present invention and the operation method thereof can be used for obtaining an image in the mobile phone.

Figure 20B:
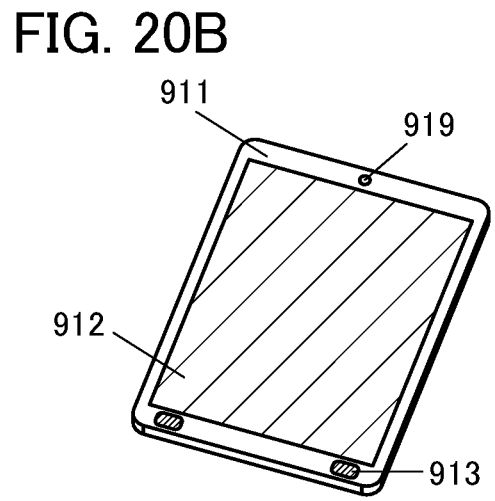

FIG. 20B is a portable data terminal, which includes a housing 911, a display portion 912, a speaker 913, a camera 919, and the like. A touch panel function of the display portion 912 enables input and output of information. Furthermore, a character or the like in an image that is captured by the camera 919 can be recognized and the character can be voice-output from the speaker 913. The imaging device of one embodiment of the present invention and the operation method thereof can be used for obtaining an image in the portable data terminal.

Figure 20C:
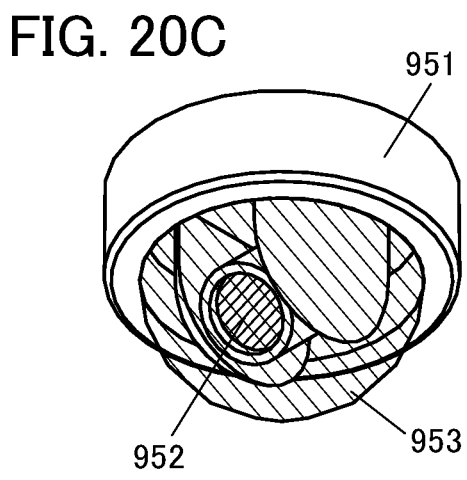

FIG. 20C is a surveillance camera, which includes a support base 951, a camera unit 952, a protection cover 953, and the like. By providing the camera unit 952 provided with a rotating mechanism and the like on a ceiling, an image of all of the surroundings can be taken. The imaging device of one embodiment of the present invention and the operation method thereof can be used for obtaining an image in the camera unit. Note that a surveillance camera is a name in common use and does not limit the use thereof. A device that has a function of a surveillance camera can also be called a camera or a video camera, for example.

Figure 20D:
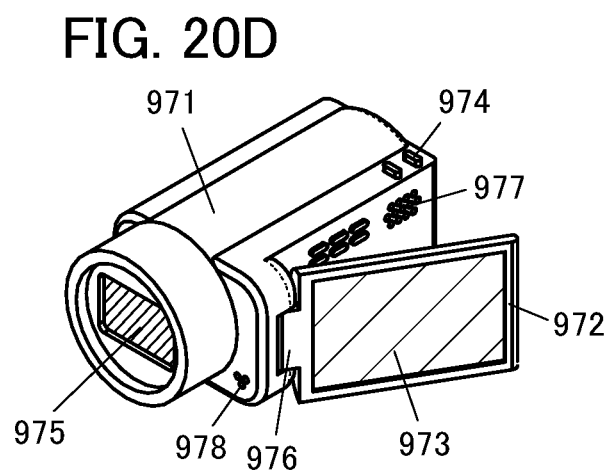

FIG. 20D is a video camera, which includes a first housing 971, a second housing 972, a display portion 973, an operation key 974, a lens 975, a connection portion 976, a speaker 977, a microphone 978, and the like. The operation key 974 and the lens 975 are provided for the first housing 971, and the display portion 973 is provided for the second housing 972. The imaging device of one embodiment of the present invention and the operation method thereof can be used for obtaining an image in the video camera.

Figure 20E:
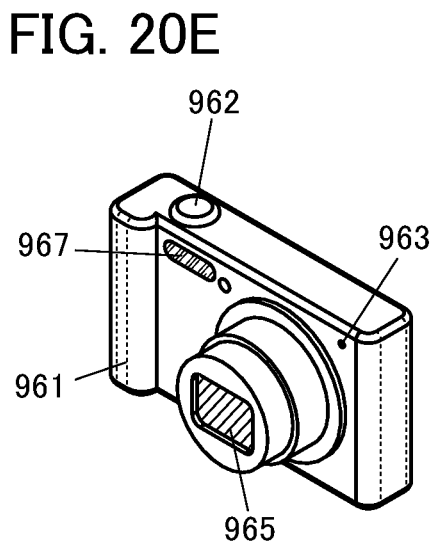

FIG. 20E is a digital camera, which includes a housing 961, a shutter button 962, a microphone 963, a light-emitting portion 967, a lens 965, and the like. The imaging device of one embodiment of the present invention and the operation method thereof can be used for obtaining an image in the digital camera.

Figure 20F:
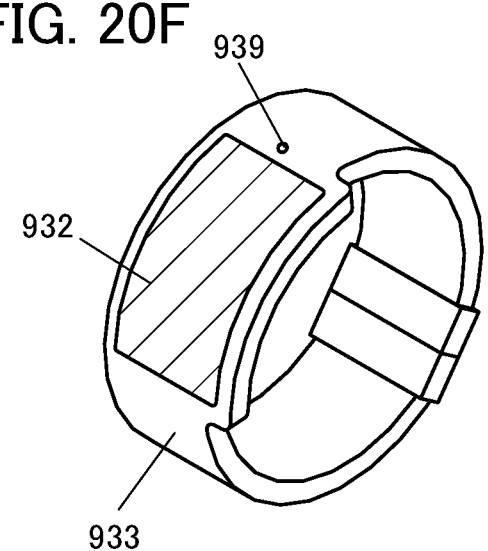

FIG. 20F is a wrist-watch-type information terminal, which includes a display portion 932, a housing and wristband 933, a camera 939, and the like. The display portion 932 is provided with a touch panel for performing the operation of the information terminal. The display portion 932 and the housing and wristband 933 have flexibility and fit a body well. The imaging device of one embodiment of the present invention and the operation method thereof can be used for obtaining an image in the information terminal.

This embodiment can be combined with any of the other embodiments and examples as appropriate.

REFERENCE NUMERALS

100: pixel, 101: photoelectric conversion device, 102: transistor, 103: transistor, 104: capacitor, 105: transistor, 106: transistor, 108: transistor, 111: wiring, 112: wiring, 112_1: wiring, 112_2: wiring, 113: wiring, 114: wiring, 115: wiring, 116: wiring, 117: wiring, 121: wiring, 122: wiring, 122_1: wiring, 122_2: wiring, 123: conductive layer, 124: conductive layer, 131: conductive layer, 132: conductive layer, 150: capacitor, 151: conductive layer, 152: insulating layer, 153: silicon substrate, 154: n-type region, 155: conductive layer, 156: insulating layer, 158: conductive layer, 161: transistor, 162: transistor, 163: capacitor, 170: circuit, 171: capacitor, 172: transistor, 173: wiring, 200: pixel block, 201: circuit, 202: capacitor, 203: transistor, 204: transistor, 205: transistor, 206: transistor, 207: resistor, 210: silicon substrate, 211: wiring, 212: wiring, 213: wiring, 215: wiring, 216: wiring, 217: wiring, 218: wiring, 219: wiring, 222: insulating layer, 222b: insulating layer, 223: insulating layer, 223b: insulating layer, 226: insulating layer, 227: insulating layer, 227b: insulating layer, 229: insulating layer, 231: insulating layer, 241: p-type region, 242: insulating layer, 243: p-type region, 244: n-type region, 245: insulating layer, 250: optical conversion layer, 251: light-blocking layer, 255: microlens array, 261: conductive layer, 262: conductive layer, 263: conductive layer, 264: n-type region, 265: n-type region, 266: conductive layer, 267: conductive layer, 300: pixel array, 301: circuit, 302: circuit, 303: circuit, 304: circuit, 305: circuit, 311: wiring, 320: memory cell, 325: reference memory cell, 330: circuit, 350: circuit, 360: circuit, 370: circuit, 501: layer, 502: layer, 503: layer, 545: semiconductor layer, 546: insulating layer, 565a: layer, 565b: layer, 565c: layer, 565d: layer, 566a: layer, 566b: layer, 566c: layer, 566d: layer, 610: package substrate, 611: package substrate, 620: cover glass, 621: lens cover, 630: adhesive, 635: lens, 640: bump, 641: land, 650: image sensor chip, 651: image sensor chip, 660: electrode pad, 661: electrode pad, 670: wire, 671: wire, 690: IC chip, 911: housing, 912: display portion, 913: speaker, 919: camera, 932: display portion, 933: housing and wristband, 939: camera, 951: support base, 952: camera unit, 953: protection cover, 961: housing, 962: shutter button, 963: microphone, 965: lens, 967: light-emitting portion, 971: housing, 972: housing, 973: display portion, 974: operation key, 975: lens, 976: connection portion, 977: speaker, 978: microphone, 981: housing, 982: display portion, 983: operation button, 984: external connection port, 985: speaker, 986: microphone, 987: camera

The invention claimed is:

1. An imaging device comprising:
a pixel block; and
a first circuit,
wherein the pixel block comprises a plurality of pixels arranged in a matrix,
wherein the pixel block is electrically connected to the first circuit,
wherein each of the plurality of pixels comprises a photoelectric conversion device, a first transistor, a second transistor, a third transistor, a first capacitor, a second capacitor, a first conductive layer and a second conductive layer,
wherein the photoelectric conversion device, the first transistor, the second capacitor and the first conductive layer are formed in a first layer,
wherein the first capacitor and the second conductive layer are formed in a second layer,
wherein the second layer is bonded to the first layer,
wherein the second conductive layer is bonded to the first conductive layer,
wherein one of a source and a drain of the first transistor is electrically connected to one of electrodes of the photoelectric conversion device,
wherein the other of the source and the drain of the first transistor is electrically connected to one of electrodes of the first capacitor via the first conductive layer and the second conductive layer,
wherein one of electrodes of the second capacitor is electrically connected to one of electrodes of the first capacitor via the first conductive layer and the second conductive layer,
wherein a first potential is supplied to the other electrode of the second capacitor,
wherein one of a source and a drain of the second transistor is electrically connected to the other electrode of the first capacitor,
wherein a gate of the third transistor is electrically connected to the other of the source and the drain of the first transistor,
wherein each of the plurality of pixels is configured to generate first data, wherein each of the plurality of pixels is configured to multiply the first data to have a given magnification to generate second data,
wherein the first circuit is configured to generate third data corresponding to a total of the first data generated by the plurality of pixels,
wherein the first circuit is configured to add a potential corresponding to a total of the second data generated by the plurality of pixels to the third data by capacitive coupling to form fourth data, and
wherein the first data and the second data each have an analog value.

2. The imaging device according to claim 1, wherein each of the first transistor and the second transistor comprises silicon in a channel formation region.

3. The imaging device according to claim 1,
wherein the first layer is formed on a first silicon substrate, and
wherein an n-type region included in the photoelectric conversion device serves as the one of the source and the drain of the first transistor.

4. The imaging device according to claim 1, wherein the first capacitor is a trench capacitor.

5. The imaging device according to claim 1,
wherein the first layer is formed on a first silicon substrate, and
wherein the first potential is a substrate potential of the first silicon substrate.

6. The imaging device according to claim 1,
wherein the third transistor is formed in the first layer, wherein the gate of the third transistor is electrically connected to the one of the electrodes of the first capacitor via the first conductive layer and the second conductive layer.

7. The imaging device according to claim 1, wherein the third transistor is formed in the second layer, wherein the gate of the third transistor is electrically connected to the other of the source and the drain of the first transistor via the first conductive layer and the second conductive layer.

8. The imaging device according to claim 1, wherein the second capacitor is a trench capacitor.

9. The imaging device according to claim 1, wherein one of a source and a drain of the third transistor is electrically connected to the first circuit.

10. An imaging device comprising:
a pixel block; and
a first circuit,
wherein the pixel block comprises a plurality of pixels arranged in a matrix,
wherein the pixel block is electrically connected to the first circuit,
wherein each of the plurality of pixels comprises a photoelectric conversion device, a first transistor, a second transistor, a third transistor, a first capacitor, a second capacitor, a first conductive layer and a second conductive layer,
wherein the photoelectric conversion device, the first transistor, the second capacitor and the first conductive layer are formed in a first layer,
wherein the first capacitor, the second conductive layer and the second transistor are formed in a second layer,
wherein the second layer is bonded to the first layer,
wherein the second conductive layer is bonded to the first conductive layer,
wherein one of a source and a drain of the first transistor is electrically connected to one of electrodes of the photoelectric conversion device,
wherein the other of the source and the drain of the first transistor is electrically connected to one of electrodes of the first capacitor via the first conductive layer and the second conductive layer,
wherein one of electrodes of the second capacitor is electrically connected to one of electrodes of the first capacitor via the first conductive layer and the second conductive layer,
wherein a first potential is supplied to the other electrode of the second capacitor,
wherein one of a source and a drain of the second transistor is electrically connected to the other electrode of the first capacitor,
wherein a gate of the third transistor is electrically connected to the other of the source and the drain of the first transistor, wherein each of the plurality of pixels is configured to generate first data,
wherein each of the plurality of pixels is configured to multiply the first data to have a given magnification to form second data,
wherein the first circuit is configured to generate third data corresponding to a total of the first data generated by the plurality of pixels, wherein the first circuit is configured to add a potential corresponding to a total of the second data generated by the plurality of pixels to the third data by capacitive coupling to form fourth data, and
wherein the first data and the second data each have an analog value.

11. The imaging device according to claim 10, wherein each of the first transistor and the second transistor comprises silicon in a channel formation region.

12. The imaging device according to claim 10, wherein the first layer is formed on a first silicon substrate, and
wherein an n-type region included in the photoelectric conversion device serve as the one of the source and the drain of the first transistor.

13. The imaging device according to claim 10, wherein the first capacitor is a trench capacitor.

14. The imaging device according to claim 10, wherein the first layer is formed on a first silicon substrate, and
wherein the first potential is a substrate potential of the first silicon substrate.

15. The imaging device according to claim 10, wherein the third transistor is formed in the first layer, wherein the gate of the third transistor is electrically connected to the one of the electrodes of the first capacitor via the first conductive layer and the second conductive layer.

16. The imaging device according to claim 10, wherein the third transistor is formed in the second layer, wherein the gate of the third transistor is electrically connected to the other of the source and the drain of the first transistor via the first conductive layer and the second conductive layer.

17. The imaging device according to claim 10, wherein the second capacitor is a trench capacitor.

18. The imaging device according to claim 10, wherein one of a source and a drain of the third transistor is electrically connected to the first circuit.

19. An electronic device comprising the imaging device according to claim 1, and a display device.

20. An electronic device comprising the imaging device according to claim 10, and a display device.

* * * * *